United States Patent
Xia et al.

(10) Patent No.: US 10,833,164 B2
(45) Date of Patent: Nov. 10, 2020

(54) LDMOS TRANSISTORS AND ASSOCIATED SYSTEMS AND METHODS

(71) Applicant: Maxim Integrated Products, Inc., San Jose, CA (US)

(72) Inventors: John Xia, Fremont, CA (US); Marco A. Zuniga, Berkeley, CA (US); Badredin Fatemizadeh, Palo Alto, CA (US); Vijay Parthasarathy, Sunnyvale, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 16/266,301

(22) Filed: Feb. 4, 2019

(65) Prior Publication Data

US 2019/0181237 A1 Jun. 13, 2019

Related U.S. Application Data

(63) Continuation of application No. 15/602,192, filed on May 23, 2017, now Pat. No. 10,199,475.

(Continued)

(51) Int. Cl.
*H01L 29/49* (2006.01)
*H01L 29/78* (2006.01)
(Continued)

(52) U.S. Cl.
CPC ...... *H01L 29/4916* (2013.01); *H01L 29/0649* (2013.01); *H01L 29/0653* (2013.01);
(Continued)

(58) Field of Classification Search
None
See application file for complete search history.

(56) References Cited

U.S. PATENT DOCUMENTS 6,365,942 B1   4/2002   Kocon et al.
6,835,993 B2 * 12/2004 Sridevan ............. H01L 29/0634
                                                           257/492
(Continued)

FOREIGN PATENT DOCUMENTS

| CN | 101796620 A | 8/2010 |
| CN | 103077895 A | 5/2013 |
| CN | 103247684 A | 8/2013 |

OTHER PUBLICATIONS

Chinese Patent Application No. 201710367154.8, First Office Action dated Sep. 26, 2019 and English-language translation thereof, 12 pages.

*Primary Examiner* — Cassandra F Cox
(74) *Attorney, Agent, or Firm* — Lathrop GPM LLP

(57) ABSTRACT

A lateral double-diffused metal-oxide-semiconductor field effect (LDMOS) transistor includes a silicon semiconductor structure, a dielectric layer at least partially disposed in a trench of the silicon semiconductor structure in a thickness direction, and a gate conductor embedded in the dielectric layer and extending into the trench in the thickness direction. The dielectric layer and the gate conductor are at least substantially symmetric with respect to a center axis of the trench extending in the thickness direction, as seen when the LDMOS transistor is viewed cross-sectionally in a direction orthogonal to the lateral and thickness directions.

17 Claims, 12 Drawing Sheets

Related U.S. Application Data

(60) Provisional application No. 62/340,742, filed on May 24, 2016.

(51) Int. Cl.

| | |
|---|---|
| *H01L 29/10* | (2006.01) |
| *H01L 29/08* | (2006.01) |
| *H01L 29/06* | (2006.01) |
| *H01L 29/423* | (2006.01) |
| *H01L 29/40* | (2006.01) |
| *H01L 29/417* | (2006.01) |
| *H01L 29/51* | (2006.01) |
| *H01L 29/66* | (2006.01) |

(52) U.S. Cl.
CPC ...... *H01L 29/0865* (2013.01); *H01L 29/0882* (2013.01); *H01L 29/1037* (2013.01); *H01L 29/1095* (2013.01); *H01L 29/404* (2013.01); *H01L 29/407* (2013.01); *H01L 29/4175* (2013.01); *H01L 29/41766* (2013.01); *H01L 29/4236* (2013.01); *H01L 29/42368* (2013.01); *H01L 29/51* (2013.01); *H01L 29/7816* (2013.01); *H01L 29/7825* (2013.01); *H01L 29/7831* (2013.01); *H01L 29/063* (2013.01); *H01L 29/402* (2013.01); *H01L 29/66484* (2013.01); *H01L 29/66681* (2013.01); *H01L 29/66704* (2013.01)

(56) References Cited

U.S. PATENT DOCUMENTS

| | | | |
|---|---|---|---|
| 7,576,388 | B1 | 8/2009 | Wilson et al. |
| 7,859,051 | B2 | 12/2010 | Siemieniec et al. |
| 7,902,020 | B2 | 3/2011 | Park |
| 8,247,869 | B2 | 8/2012 | Yang et al. |
| 8,647,950 | B2 | 2/2014 | Zuniga et al. |
| 8,716,794 | B2 * | 5/2014 | Luo ............... H01L 27/1203 257/343 |
| 9,035,386 | B2 | 5/2015 | Chan et al. |
| 9,082,846 | B2 | 7/2015 | Lu et al. |
| 9,450,056 | B2 | 9/2016 | Ng et al. |
| 10,269,916 | B2 * | 4/2019 | Xia ............... H01L 29/404 |
| 2013/0105887 | A1 | 5/2013 | Zuniga et al. |
| 2013/0292763 | A1 | 11/2013 | Chang et al. |
| 2014/0054684 | A1 | 2/2014 | Darwish et al. |
| 2014/0225192 | A1 | 8/2014 | Lee et al. |
| 2014/0320174 | A1 | 10/2014 | Lu et al. |
| 2015/0115362 | A1 | 4/2015 | Su et al. |
| 2017/0243977 | A1 | 8/2017 | Lin et al. |

* cited by examiner

US 10,833,164 B2

LDMOS TRANSISTORS AND ASSOCIATED SYSTEMS AND METHODS

RELATED APPLICATIONS

This application is a continuation of U.S. patent application Ser. No. 15/602,192, filed May 23, 2017, which claims benefit of priority to U.S. Provisional Patent Application Ser. No. 62/340,742, filed May 24, 2016. Each of the above-mentioned applications is incorporated herein by reference.

BACKGROUND

Metal-oxide-semiconductor field effect transistors, often referred to as MOSFETS, are widely used in electronic devices, such as for switching or amplification. MOSFETS are capable of achieving fast switching speeds, which makes them well suited for use in high-frequency applications. Additionally, MOSFETS are relatively simple to control because they are voltage-controlled, instead of current-controlled, devices.

Lateral double-diffused metal-oxide-semiconductor field effect transistors, often referred to as LDMOS transistors, are a class of MOSFETS where drain-to-source voltage is blocked within the transistors' semiconductor material primarily in a lateral direction. LDMOS transistors are often combined with other circuitry in integrated circuits, especially in power applications or radio-frequency applications.

FIG. 1 is a cross-sectional view of a conventional n-channel LDMOS transistor 100 including a silicon semiconductor structure 102, a source electrode 104, a gate structure 106, and a drain electrode 108. Source electrode 104 is stacked on a top surface 110 of silicon semiconductor structure 102 in a source region 112 of LDMOS transistor 100, and drain electrode 108 is stacked on top surface 110 in a drain region 114 of LDMOS transistor 100. Gate structure 106 includes a gate electrode 116, a polysilicon layer 117, and a silicon dioxide layer 118 stacked in a gate region 120 of LDMOS transistor 100. Silicon semiconductor structure 102 includes a p-type substrate 122, an n-well 124, a p-body 126, a source p+ region 128, a source n+ region 130, and a drain n+ region 132. N-well 124 is formed on p-type substrate 122, and p-body 126 is formed in n-well 124 under source electrode 104. Drain n+ region 132 is formed in n-well 124 and contacts drain electrode 108. Each of source p+ region 128 and source n+ region 130 is formed in p-body 126 and contacts source electrode 104. Each of source n+ region 130 and drain n+ region 132 is more heavily doped than n-well 124, and source p+ region 128 is more heavily doped than p-body 126.

When positive voltage $V_{DS}$ is applied across drain electrode 108 and source electrode 104, a p-n junction at the interface of n-well 124 and p-body 126 is reversed biased. Consequentially, essentially no current flows from drain electrode 108 to source electrode 104 by default. The relative dopant concentration of drain n+ region 132 and n-well 124 causes a portion of n-well 124 referred to as a drift region 134 to carry the majority of voltage $V_{DS}$, thereby enabling LDMOS transistor 100 to support a relatively large value of $V_{DS}$ without breakdown.

A positive voltage $V_{GS}$ applied between gate electrode 116 and source electrode 104 creates negative charges in silicon semiconductor structure 102 under silicon dioxide layer 118, causing a minority-carrier channel to form in a region 136 of p-body 126. This channel has excess electrons and will therefore conduct electric current. Consequentially, current will flow in the lateral 138 direction through silicon semiconductor structure 102 from drain n+ region 132 to source n+ region 130 when $V_{GS}$ exceeds a threshold value and $V_{DS}$ is a positive value. The current can encounter substantial resistance, however, in drift region 134 due to relatively light n-type dopant concentration in n-well 124.

DETAILED DESCRIPTION OF THE EMBODIMENTS

Applicant has developed LDMOS transistors and associated systems and methods which significantly advance the state of the art. Certain embodiments include a plurality of gate conductors to promote low on-resistance and high breakdown voltage. Additionally, some embodiments include one or more structures at least partially formed in a trench of a silicon semiconductor structure, to promote high transistor performance and small transistor pitch.

Figure 1:
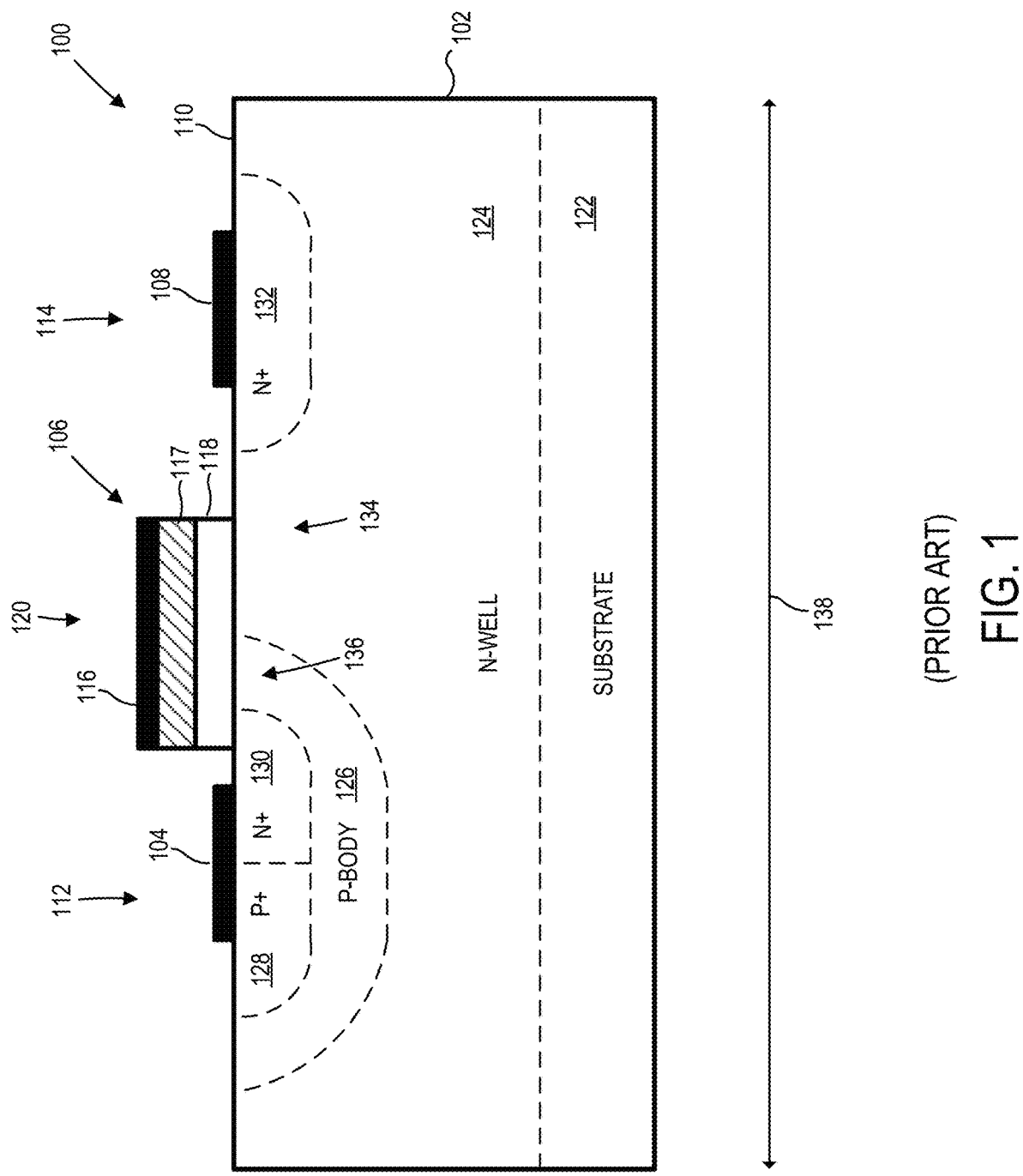
FIG. 1 is a cross-sectional view of a prior-art LDMOS transistor.
Figure 2:
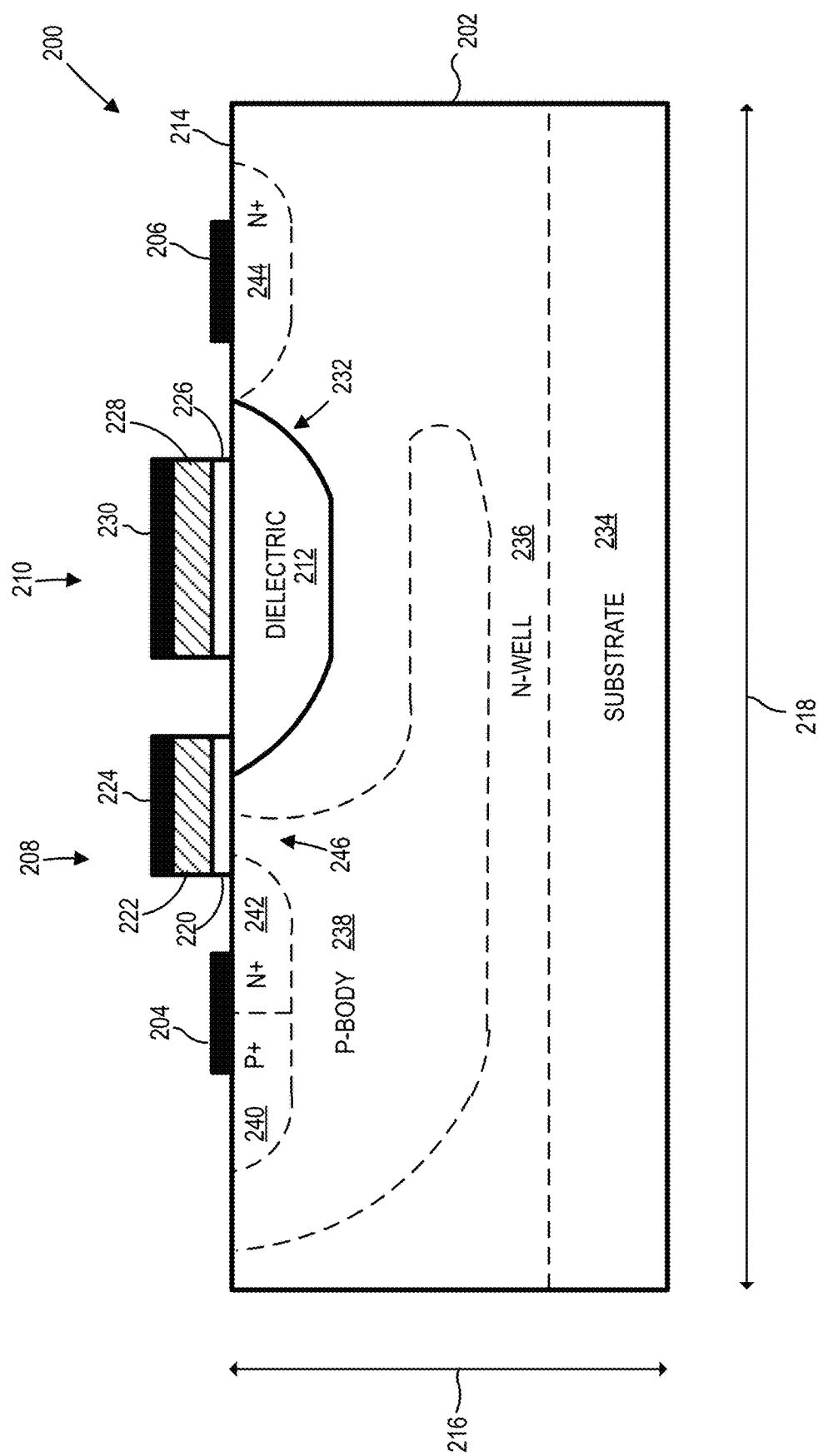
FIG. 2 is a cross-sectional view of a LDMOS transistor including two gate structures, according to an embodiment.

FIG. 2 is a cross-sectional view of a dual-gate structure LDMOS transistor 200 including a silicon semiconductor structure 202, a source electrode 204, a drain electrode 206, a first gate structure 208, a second gate structure 210, and a trench dielectric layer 212. Source electrode 204 and drain electrode 206 are each disposed on a first outer surface 214 of silicon semiconductor structure 202. First gate structure 208 and second gate structure 210 are separated from each other in a lateral direction 218 orthogonal to a thickness direction 216. First gate structure 208 includes a first gate dielectric layer 220, a first gate conductor 222, and a first gate electrode 224 stacked on first outer surface 214 in the thickness 216 direction. Second gate structure 210 includes a second gate dielectric layer 226, a second gate conductor 228, and a second gate electrode 230 stacked on first outer surface 214 in the thickness 216 direction. Second gate structure 210 is optionally longer in the lateral 218 direction than first gate structure 208 to promote high breakdown voltage of LDMOS transistor 200 and/or to promote low accumulation resistance.

Trench dielectric layer 212 is embedded in a trench 232 of silicon semiconductor structure 202 such that trench dielectric layer 212 extends at least partially under each of first and second gate structures 208 and 210 in the thickness 216 direction. First gate dielectric layer 220, second gate dielectric layer 226, and trench dielectric layer 212 are each formed, for example, of silicon dioxide.

First and second gate conductors 222 and 228 are each formed, for example, of polysilicon. Although first gate dielectric layer 220, second gate dielectric layer 226, and trench dielectric layer 212 are illustrated as being separate elements, one or more of these dielectric layers may be combined without departing from the scope hereof.

Silicon semiconductor structure 202 includes a p-type substrate 234, an n-well 236, a p-body 238, a source p+ region 240, a source n+ region 242, and a drain n+ region 244. Source p+ region 240 has a greater p-type dopant concentration than p-body 238, and each of source and drain n+ regions 242 and 244 has a greater n-type dopant concentration than n-well 236. N-well 236 is formed on substrate 234, and p-body 238 is formed in n-well 236 at least partially under source electrode 204. Drain n+ region 244 is formed in n-well 236 and contacts drain electrode 206. Each of source p+ region 240 and drain n+ region 242 is formed in p-body 238 and contacts source electrode 204. Trench dielectric layer 212 is disposed between at least a portion of p-body 238 and drain n+ region 244 in the lateral 218 direction. P-type substrate 234 could be replaced with a different type of substrate, such as an n-type substrate or an intrinsic substrate, without departing from the scope hereof. Silicon semiconductor structure 202 can include additional impurity regions without departing from the scope hereof.

One or more regions of silicon semiconductor structure 202 optionally has a graded dopant concentration. For example, in some embodiments, n-well 236 has a graded n-type dopant concentration where n-type dopant concentration is greatest near drain n+ region 244, and p-body 238 has a graded p-type dopant concentration where p-type dopant concentration is greatest near source n+ region 242. P-body 238 optionally extends at least partially under each of first gate structure 208 and second gate structure 210, as illustrated, to achieve a reduced surface field effect, thereby enabling n-well 236 to have a relatively high n-type dopant concentration to promote low on-resistance of LDMOS transistor 200, without diminishing breakdown voltage of the transistor 200.

When positive voltage $V_{DS}$ is applied across drain electrode 206 and source electrode 204, a p-n junction formed at the interface of n-well 236 and p-body 238 is reversed biased, so that very little current flows between drain electrode 206 and source electrode 204 by default. However, a positive voltage $V_{GS}$ applied between first gate electrode 224 and source electrode 204 creates negative charges in semiconductor structure 202 under first gate dielectric layer 220, causing a minority-carrier channel to form in a region 246 of p-body 238. This channel has excess electrons and therefore conducts electric current through p-body 238 from n-well 236 to source n+ region 242. Consequentially, current will flow predominately in the lateral 218 direction through silicon semiconductor structure 202 from drain n+ region 244 to source n+ region 242 when $V_{GS}$ exceeds a threshold value and $V_{DS}$ is a positive value. The threshold value is established, in part, by the dopant concentration in p-body 238 and by the thickness of first gate dielectric layer 220. For example, threshold voltage can be reduced by decreasing p-type dopant concentration in p-body 238 adjacent to first gate structure 208 and/or by decreasing thickness of first gate dielectric layer 220. Source p+ region 240 forms an ohmic contact between p-body 238 and source electrode 204 to help prevent a parasitic bipolar junction transistor (not shown) in silicon semiconductor substrate 202 from activating.

Second gate structure 210 can advantageously be used to promote both low on-resistance and high breakdown of LDMOS transistor 200. In particular, a positive bias voltage applied to second gate electrode 230 relative to source electrode 204 causes negative charges to collect in n-well 236 under trench dielectric layer 212. These negative charges create a majority-carrier channel in n-well 236 adjacent to trench dielectric layer 212, thereby providing a low-resistance current path through n-well 236. Additionally, applying a positive bias voltage to second gate electrode 230 reduces potential difference between drain n+ region 244 and second gate conductor 228, thereby promoting high breakdown voltage of LDMOS transistor 200. A constant bias voltage is optionally applied to second gate electrode 230, i.e., bias voltage on second gate electrode 230 remains constant even as voltage on first gate electrode 224 changes during switching of LDMOS transistor 200, to promote low switching losses in LDMOS transistor 200 and simplicity of circuitry (not shown) biasing second gate electrode 230.

Figure 3:
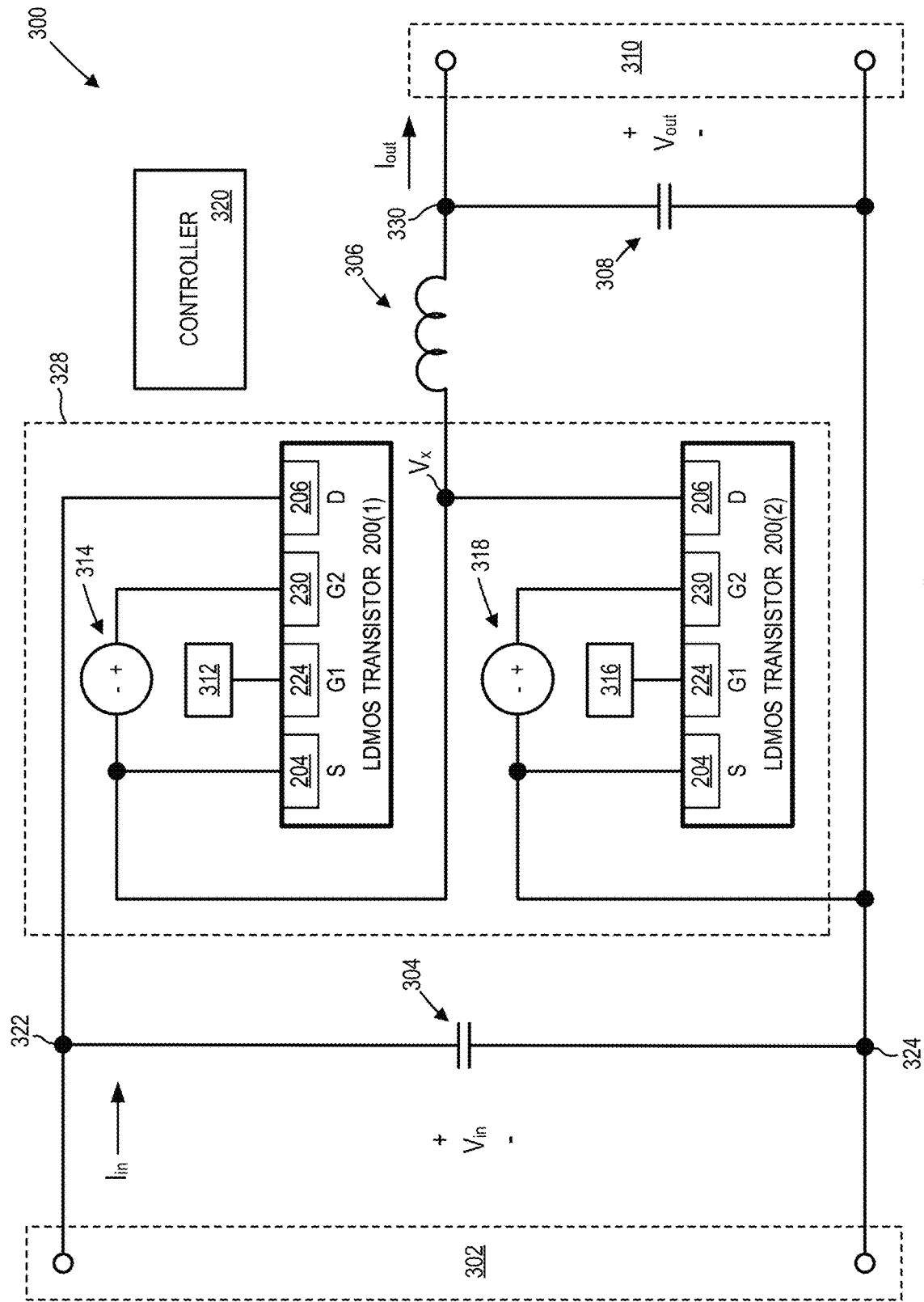
FIG. 3 schematically illustrates a buck converter including two instances of the LDMOS transistor of FIG. 2, according to an embodiment.

One possible application of LDMOS transistor 200 is in a switching power converter. For example, FIG. 3 schematically illustrates a buck converter 300 including two instances of LDMOS transistor 200, hereinafter referred to as LDMOS transistor 200(1) and LDMOS transistor 200(2). LDMOS transistors 200(1) and 200(2) are schematically illustrated in FIG. 3 to promote illustrative clarity. Buck converter 300 further includes an input port 302 electrically coupled to an input power source (not shown), an input capacitor 304, an inductor 306, an output capacitor 308, an output port 310 electrically coupled to a load (not shown), first driver circuitry 312, first bias circuitry 314, second driver circuitry 316, second bias circuitry 318, and a controller 320.

Input port 302 is electrically coupled across a positive input node 322 and a reference node 324. Input capacitor 304 is electrically coupled across positive input node 322 and reference node 326, and input capacitor 304 provides a path for input ripple current drawn by buck converter 300. Drain electrode 206 of LDMOS transistor 200(1) is electrically coupled to positive input node 322, and source electrode 204 of LDMOS transistor 200(1) is electrically coupled to a switching node $V_x$. First gate electrode 224 and second gate electrode 230 of LDMOS transistor 200(1) are electrically coupled to first driver circuitry 312 and first bias circuitry 314, respectively. Drain electrode 206 of LDMOS transistor 200(2) is electrically coupled to switching node $V_x$, and source electrode 204 of LDMOS transistor 200(2) is electrically coupled to reference node 324. First gate electrode 224 and second gate electrode 230 of LDMOS transistor 200(2) are electrically coupled to second driver circuitry 316 and second bias circuitry 318, respectively.

LDMOS transistors 200(1) and 200(2), first driver circuitry 312, first bias circuitry 314, second driver circuitry 316, and second bias circuitry 318 collectively form a switching circuit 328. Inductor 306 is electrically coupled between switching node $V_x$ and a positive output node 330, and output port 310 is electrically coupled across positive output node 330 and reference node 324. Output capacitor 308 is electrically coupled across positive output node 330 and reference node 324, and output capacitor 308 provides a path for output ripple current generated by buck converter 300.

Controller 320 controls switching of switching circuit 328 to transfer power from the power source (electrically coupled to input port 302) to the load (electrically coupled to output port 310). In particular, controller 320 controls first driver circuitry 312 to repeatedly switch first gate electrode 224 of LDMOS transistor 200(1) between two different voltage magnitudes, to repeatedly create and destroy a minority-carrier channel in p-body 238 of LDMOS transistor 200(1). Consequentially, LDMOS transistor 200(1) repeatedly switches between its conductive and non-conductive states under the control of controller 320. Controller 320 also controls second driver circuitry 316 to repeatedly switch first gate electrode 224 of LDMOS transistor 200(2) between two different voltage magnitudes to cause LDMOS transistor 200(2) to repeatedly switch between its conductive and non-conductive states. Controller 320 controls switching of LDMOS transistor 200(2) such that it performs a freewheeling function, or in other words, so that LDMOS transistor 200(2) provides a path for current flowing through inductor 306 when LDMOS transistor 200(1) is in its non-conductive state. In some embodiments, controller 320 controls switching of switching circuit 328 to regulate one or more parameters of buck converter 300, such as input voltage $V_{in}$, input current $I_{in}$, input power $P_{in}$, output voltage $V_{out}$, output current $I_{out}$, and output power $P_{out}$. Connections between controller 320 and other components of buck converter 300 are not shown to promote illustrative clarity.

First bias circuitry 314 maintains a constant voltage on second gate electrode 230 of LDMOS transistor 200(1) to establish a majority-carrier channel in n-well 236 of the transistor, thereby promoting low on-resistance and high breakdown voltage of the transistor. Similarly, second bias circuitry 318 maintains a constant voltage on second gate electrode 230 of LDMOS transistor 200(2) to establish a majority-carrier channel in n-well 236 of the transistor, thereby promoting low on-resistance and high breakdown voltage of the transistor.

It should be appreciated that LDMOS transistor 200 is not limited to use in a buck converter, or even to use in a switching power converter. For example, LDMOS transistor 200 could alternately be used in an amplifier.

Figure 4:
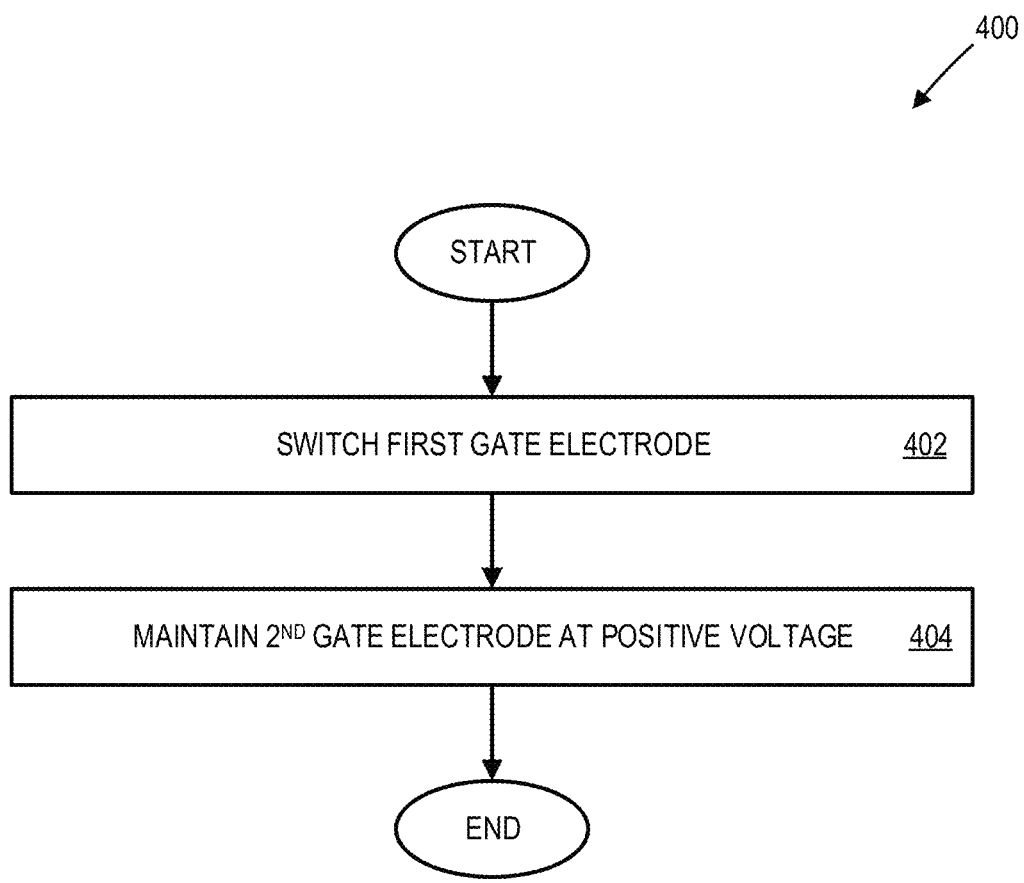
FIG. 4 illustrates a method for reducing on-resistance in a LDMOS transistor, according to an embodiment.

FIG. 4 illustrates a method 400 for reducing on-resistance in a LDMOS transistor. In step 402, a first gate electrode is repeatedly switched between at least two different voltage magnitudes relative to a source electrode to repeatedly create and destroy a minority-carrier channel in a p-body of the transistor. In one example of step 402, first driver circuitry 312 repeatedly switches first gate electrode 224 of LDMOS transistor 200(1) between two different voltage magnitudes, to repeatedly create and destroy a minority-carrier channel in p-body 238 of LDMOS transistor 200(1). (See FIGS. 2 and 3). In step 404, a second gate electrode is maintained at a positive voltage relative to the source electrode to create a majority-carrier channel in an n-doped portion of the LDMOS transistor. In one example of step 404, first bias circuitry 314 maintains a constant positive voltage on second gate electrode 230 of LDMOS transistor 200(1) to establish a majority-carrier channel in n-well 236 of LDMOS transistor 200(1). (See FIGS. 2 and 3).

Figure 5:
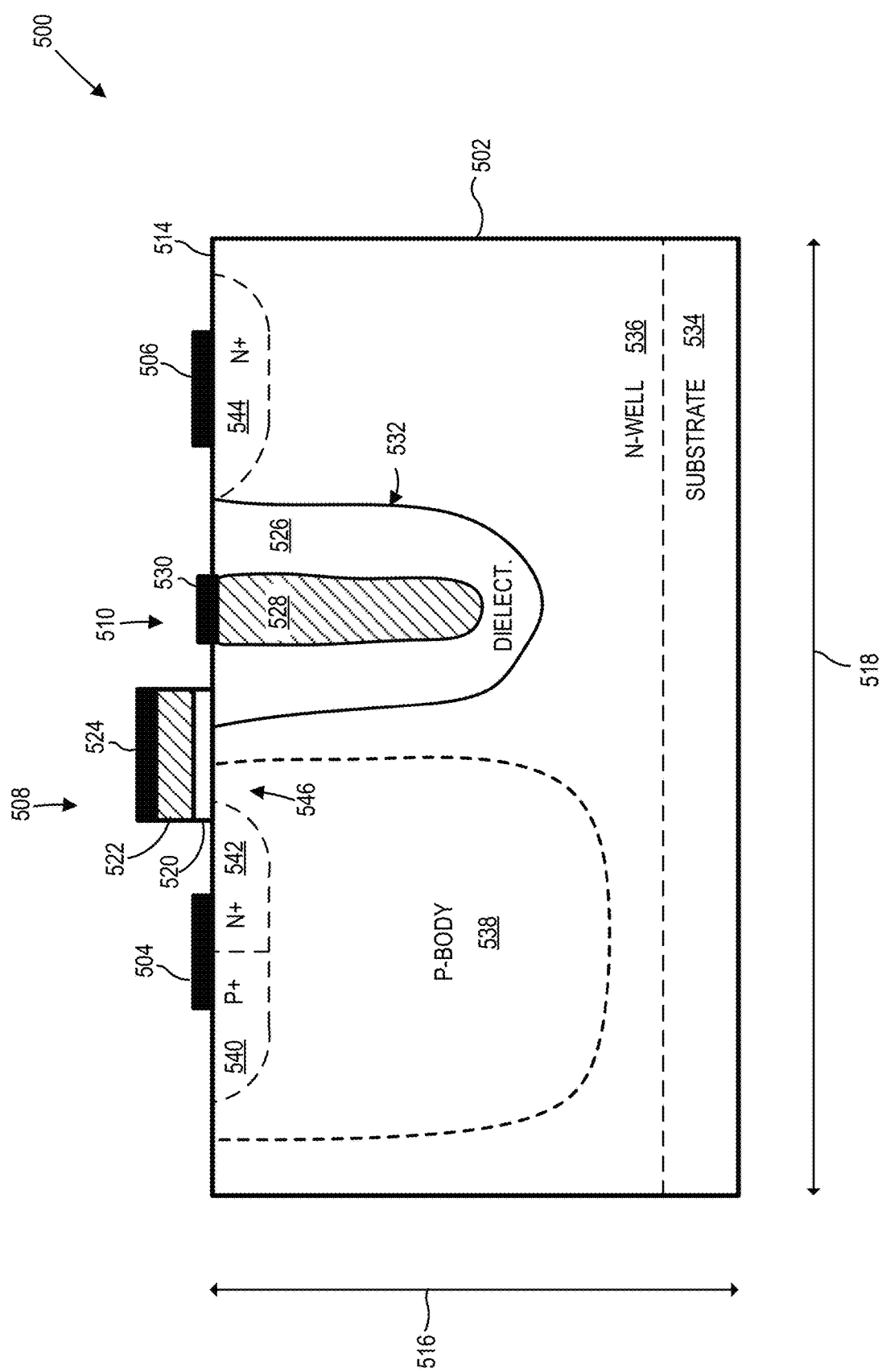
FIG. 5 is a cross-sectional view of a LDMOS transistor including two gate structures where one of the gate structures is partially formed in a trench, according to an embodiment.

Applicant has additionally determined that a second gate region can be at least partially formed in a trench, to further promote high breakdown voltage and small transistor size. For example, FIG. 5 is a cross-sectional view of a LDMOS transistor 500 including two gate structures, where one of the two gate structures is partially formed in a trench. LDMOS transistor 500 includes a silicon semiconductor structure 502, a source electrode 504, a drain electrode 506, a first gate structure 508, and a second gate structure 510. Source electrode 504 and drain electrode 506 are each disposed on a first outer surface 514 of silicon semiconductor structure 502.

First gate structure 508 and second gate structure 510 are at least partially separated from each other in a lateral direction 518. First gate structure 508 includes a first gate dielectric layer 520, a first gate conductor 522, and a first gate electrode 524 stacked on first outer surface 514 in a thickness 516 direction orthogonal to lateral 518 direction. Second gate structure 510 includes a second gate conductor 528, a second gate dielectric layer 526, and a gate electrode 530. Second gate conductor is 528 embedded in second gate dielectric layer 526 in a trench 532 of silicon semiconductor structure 502, and second gate electrode 530 contacts second gate conductor 528. First gate dielectric layer 520 and second gate dielectric layer 526 are each formed, for example, of silicon dioxide. First gate conductor 522 and second gate conductor 528 are each formed, for example, of polysilicon.

Silicon semiconductor structure 502 includes a p-type substrate 534, an n-well 536, a p-body 538, a source p+ region 540, a source n+ region 542, and a drain n+ region 544. Source p+ region 540 has a greater p-type dopant concentration than p-body 538, and each of source and drain n+ regions 542 and 544 has a greater n-type dopant concentration than n-well 536. N-well 536 is formed on substrate 534, and p-body 538 is formed in n-well 536 at least partially under source electrode 504. Drain n+ region 544 is formed in n-well 536 and contacts drain electrode 506. Each of source p+ region 540 and source n+ region 542 is formed in p-body 538 and contacts source electrode 504. Second gate dielectric layer 526 and second gate conductor 528 are disposed between p-body 538 and drain n+ region 544 in the lateral 518 direction. P-type substrate 534 could be replaced with a different type of substrate, such as an n-type substrate or an intrinsic substrate, without departing from the scope hereof. Silicon semiconductor structure 502 can include additional impurity regions without departing from the scope hereof.

One or more regions of silicon semiconductor structure 502 optionally has a graded dopant concentration. For example, in some embodiments, n-well 536 has a graded n-type dopant concentration where n-type dopant concentration is greatest near drain n+ region 544, and p-body 538 has a graded p-type dopant concentration where p-type dopant concentration is greatest near source n+ region 542. P-body 538 optionally extends deeper into silicon semiconductor structure 502 than second gate structure 510, as illustrated, to achieve a reduced surface field effect, thereby enabling n-well 536 to have a relatively high n-type dopant concentration to promote low on-resistance of LDMOS transistor 500, without diminishing breakdown voltage of LDMOS transistor 500.

LDMOS transistor 500 may be operated in a manner similar to that discussed above with respect to LDMOS transistor 200 of FIG. 2. For example, a positive voltage $V_{GS}$ may be applied between first gate electrode 524 and source electrode 504 to create negative charges in semiconductor structure 502 under first gate dielectric layer 520, causing a minority-carrier channel to form in a region 546 of p-body 538. Additionally, a positive bias voltage can be applied to second gate electrode 530 relative to source electrode 504 to cause negative charges to collect in n-well 536 in the vicinity of second gate dielectric layer 526, to create a majority-carrier channel in n-well 536 around second gate dielectric layer 526, thereby promoting low on-resistance and high breakdown voltage of LDMOS transistor 500.

Possible applications of LDMOS transistor 500 include, but are not limited to, switching power converter applications. For example, each of LDMOS transistors 200(1) and 200(2) in buck converter 300 of FIG. 3 could be replaced with a respective instance of LDMOS transistor 500. LDMOS transistor 500 could also be used with method 400 of FIG. 4.

Figure 6:
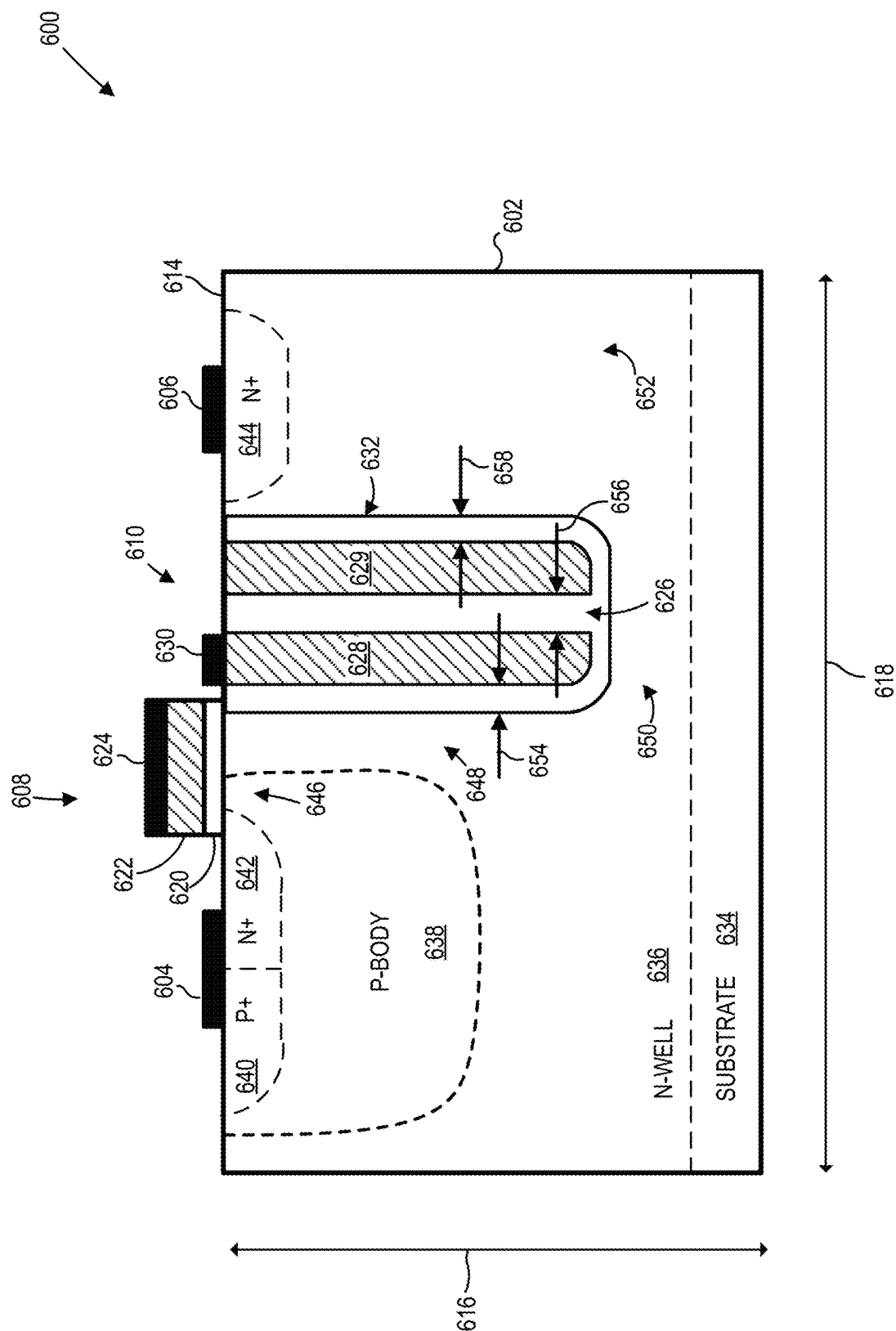
FIG. 6 is a cross-sectional view of a LDMOS transistor including three gate conductors, where two of the gate conductors are at least partially formed in a trench, according to an embodiment.

Applicant has determined that use of additional gate conductors can further improve transistor performance, with the possible drawback of increased manufacturing cost. FIG. 6 is a cross-sectional view of a LDMOS transistor 600 including three gate conductors, where two of the gate conductors are at least partially formed in a trench. LDMOS transistor 600 includes a silicon semiconductor structure 602, a source electrode 604, a drain electrode 606, a first gate structure 608, and a second gate structure 610. Source electrode 604 and drain electrode 606 are each disposed on a first outer surface 614 of silicon semiconductor structure 602.

First gate structure 608 and second gate structure 610 are at least partially separated from each other in a lateral direction 618. First gate structure 608 includes a first gate dielectric layer 620, a first gate conductor 622, and a first gate electrode 624 stacked on first outer surface 614 in a thickness 616 direction, where the thickness direction 616 is orthogonal to the lateral direction 618. Second gate structure 610 includes a second gate conductor 628, a third gate conductor 629, a second gate dielectric layer 626, and a second gate electrode 630. Second and third gate conductors 628 and 629 are each embedded in second gate dielectric layer 626 in a trench 632 of silicon semiconductor structure 602. Second gate conductor 628 and third gate conductor 629 are separated from each other in the lateral 618 direction. Second gate electrode 630 contacts second gate conductor 628, while third gate conductor 629 is optionally electrically floating, i.e., it does not contact a gate electrode. First gate dielectric layer 620 and second gate dielectric layer 626 are each formed, for example, of silicon dioxide. First gate conductor 622, second gate conductor 628, and third gate conductor 629 are each formed, for example, of polysilicon.

Silicon semiconductor structure 602 includes a p-type substrate 634, an n-well 636, a p-body 638, a source p+ region 640, a source n+ region 642, and a drain n+ region 644. Source p+ region 640 has a greater p-type dopant concentration than p-body 638, and each of source and drain n+ regions 642 and 644 has a greater n-type dopant concentration than n-well 636. N-well 636 is formed on substrate 634, and p-body 638 is formed in n-well 636 at least partially under source electrode 604. Drain n+ region 644 is formed in n-well 636 and contacts drain electrode 606. Each of source p+ region 640 and source n+ region 642 is formed in p-body 638 and contacts source electrode 604. N-well 636 includes a first portion 648, a second portion 650, and third portion 652. First portion 648 is between p-body 638 and second gate structure 610, and second portion 650 is below second gate structure 610 in the thickness 616 direction. Third portion 652 is below drain n+ region 644.

Second gate dielectric layer 626, second gate conductor 628, and third gate conductor 629 are laterally 618 disposed between p-body 638 and drain n+ region 644. Second gate conductor 628 is laterally disposed between p-body 638 and third gate conductor 629, and third gate conductor 629 is laterally disposed between second gate conductor 628 and drain n+ region 644. Second gate conductor 628 is separated from first portion 648 of n-well 636 by a first lateral separation distance 654, and first and second gate conductors 628 and 629 are separated from each other by a second lateral separation distance 656. Third gate conductor 629 is separated from third portion 652 of n-well 636 by a third lateral separation distance 658. In some embodiments, second lateral separation distance 656 is greater than each of first lateral separation distance 654 and third lateral separation distance 658. In a particular embodiment, each of first lateral separation distance 654 and third lateral separation distance 658 is 0.12 microns, and second lateral separation distance 656 is 0.18 microns.

Use of two gate conductors, i.e. first and second gate conductors 628 and 629 in second gate structure 610 helps achieve optimization of both on-resistance and breakdown voltage. In particular, first lateral separation distance 654 significantly affects source resistance, while third lateral separation distance 658 significantly affects breakdown voltage. Use of first and second gate conductors 628 and 629 enables first lateral separation distance 654 and third lateral separation distance 658 to be individually selected, thereby promoting optimization of both on-resistance and breakdown voltage. If second gate conductor 629 were instead omitted, it would not be feasible to optimize both on-resistance and breakdown voltage. Second lateral separation distance 656 is, for example, sufficiently large to support a desired voltage between first and second gate conductors 628 and 629, as well as to promote manufacturability of LDMOS transistor 600.

One or more regions of silicon semiconductor structure 602 optionally has a graded dopant concentration. For example, in some embodiments, n-well 636 has a graded n-type dopant concentration where n-type dopant concentration is greatest near drain n+ region 644, and p-body 638 has a graded p-type dopant concentration where p-type dopant concentration is greatest near source n+ region 642. Second gate structure 610 optionally extends deeper into silicon semiconductor structure 602 than p-body 638 in the thickness 616 direction, as illustrated, to effectively embed the drain drift region into silicon semiconductor structure 602, thereby promoting small device pitch, i.e. small lateral 618 spacing of adjacent LDMOS transistors 600. Small device pitch, in turn promotes low on-resistance, as well as low capacitance by shielding miller capacitance. P-type substrate 634 could be replaced with a different type of substrate, such as an n-type substrate or an intrinsic substrate, without departing from the scope hereof. Silicon semiconductor structure 602 can include additional impurity regions without departing from the scope hereof.

LDMOS transistor 600 may be operated in a manner similar to that discussed above with respect to LDMOS transistor 200 of FIG. 2. For example, a positive voltage $V_{GS}$ may be applied between first gate electrode 624 and source electrode 604 to create negative charges in semiconductor structure 602 under first gate dielectric layer 620, causing a minority-carrier channel to form in a region 646 of p-body 638. Additionally, a positive bias voltage applied to second gate electrode 630 relative to source electrode 604 causes negative charges to collect in first portion 648 of n-well 636 in the vicinity of second gate dielectric layer 626, to create a majority-carrier channel in first portion 648 of n-well 636. Third gate conductor 629 increases spacing between second gate conductor 628 and drain n+ region 644, thereby advantageously promoting low gate-to-drain capacitance and high breakdown voltage. Third gate conductor 629 will typically become capacitively charged to a voltage between that of drain electrode 606 and second gate conductor 628 during switching of LDMOS transistor 600, due to the third gate conductor 629 being electrically floating. Third gate conductor 629 could alternately be biased with respect to source electrode 604 without departing from the scope hereof.

Possible applications of LDMOS transistor 600 include, but are not limited to, switching power converter applications. For example, each of LDMOS transistors 200(1) and 200(2) in buck converter 300 of FIG. 3 could be replaced with a respective instance of LDMOS transistor 600. LDMOS transistor 600 can also be used with method 400 of FIG. 4.

Figure 8:
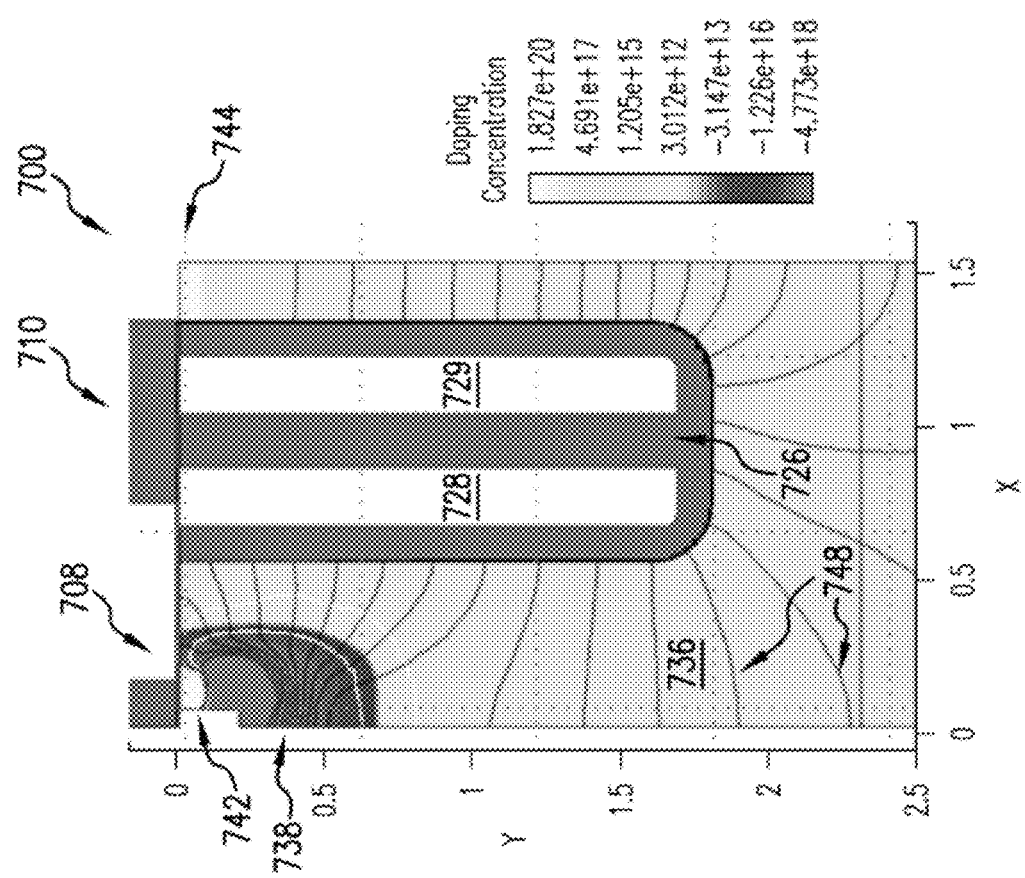
FIG. 8 is cross-sectional view of the FIG. 7 LDMOS transistor with one of the gate conductors biased at 20 volts with respect to the source electrode, according to an embodiment.
Figure 7:
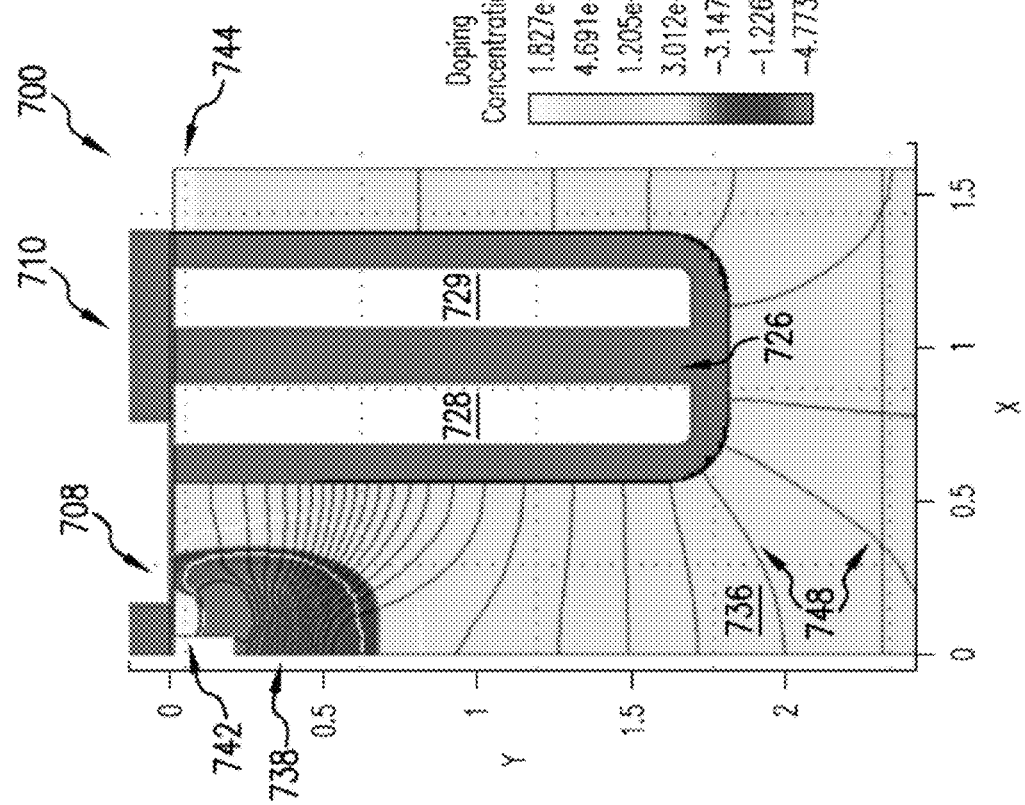
FIG. 7 is a cross-sectional view of a LDMOS transistor including three gate conductors, where one of the gate conductors is not biased with respect to a source electrode, according to an embodiment.

FIGS. 7 and 8 collectively illustrate how biasing a second gate conductor can promote high breakdown voltage of an LDMOS transistor. FIG. 7 is a cross-sectional view of an LDMOS transistor 700, which is similar to LDMOS transistor 600 of FIG. 6. LDMOS transistor 700 includes a first gate structure 708, a second gate structure 710, an n-well 736, a p-body 738, a source n+ region 742, and a drain n+ region 744. Second gate structure 710 includes a second gate dielectric layer 726, a second gate conductor 728, and a third gate conductor 729. Third gate conductor 729 is electrically floating. Second gate conductor 728 is not biased relative to the source electrode in FIG. 7. Lines 748 illustrate simulated electric potential in LDMOS transistor 700 when the transistor is operating in its conductive state. Only some lines 748 are illustrated to promote illustrative clarity. There is large potential gradient between p-body 738 and second gate dielectric layer 726, as can be observed in FIG. 7.

FIG. 8 is a cross-sectional view of LDMOS transistor 700 like that of FIG. 7, but with second gate conductor 728 biased at 20 volts with respect to the source electrode. As can be appreciated by comparing FIGS. 7 and 8, electric potential is significantly more evenly distributed when second gate conductor 728 is biased at 20 volts than when second gate conductor 728 is not biased. Consequentially, biasing second gate conductor 728 with respect to the source electrode promotes high breakdown voltage in LDMOS transistor 700.

Figure 9:
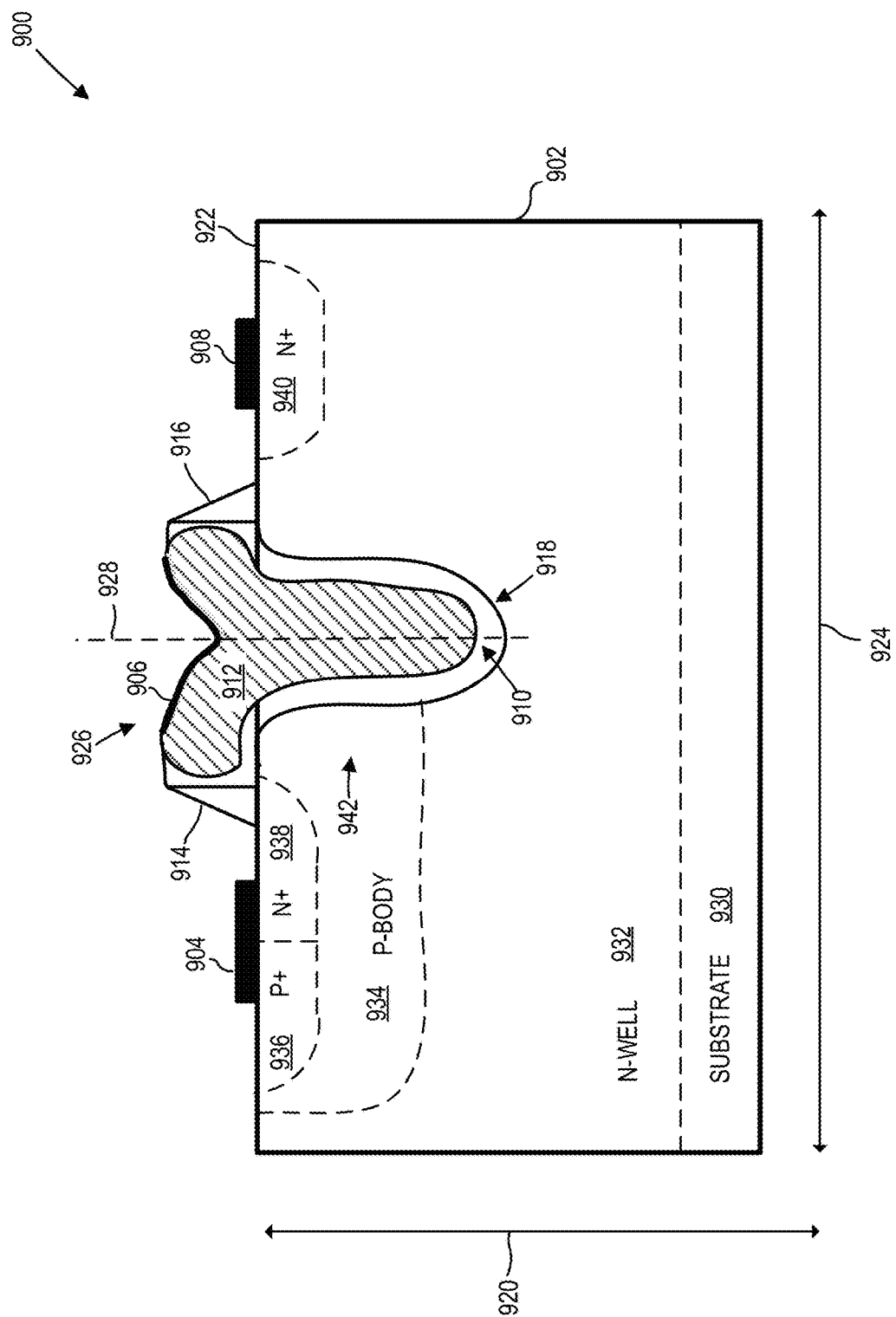
FIG. 9 is a cross-sectional view of a LDMOS transistor including a symmetrical gate structure formed in a trench, according to an embodiment.

FIG. 9 is a cross-sectional view of a LDMOS transistor 900 including a symmetrical gate structure formed in a trench. LDMOS transistor 900 includes a silicon semiconductor structure 902, a source electrode 904, a gate electrode 906, a drain electrode 908, a dielectric layer 910, a gate conductor 912, and spacers 914 and 916. A trench 918 is formed in silicon semiconductor structure 902 in a thickness 920 direction, and dielectric layer 910 is disposed in trench 918 and extends to a first outer surface 922 of silicon semiconductor structure 902. Gate conductor 912 is embedded in dielectric layer 910 and extends into trench 918 in the thickness 920 direction. Gate conductor 912 is separated from silicon semiconductor structure 902 by dielectric layer 910. Spacers 914 and 916 are separated from each other in a lateral 924 direction, where the lateral direction 924 is orthogonal to the thickness 920 direction. Spacers 914 and 916 bound dielectric layer 910 and gate conductor 912 on first outer surface 922 of silicon semiconductor structure 922.

A gate structure 926 formed of gate conductor 912 and dielectric layer 910 is at least substantially symmetrical. In particular, each of dielectric layer 910 and gate conductor 912 is at least substantially symmetrical with respect to a center axis 928 of trench 918 extending in the thickness 920 direction, when LDMOS transistor 900 is view cross-sectionally in a direction orthogonal to the thickness 920 and lateral 924 directions (i.e., into the page of FIG. 9). Such substantially symmetrical configuration advantageously promotes manufacturing simplicity, thereby helping achieve high conductivity of LDMOS transistor 900 in its on-state, in applications where acceptable on-resistance and breakdown voltage ratings can be achieved with similar thicknesses of dielectric layer 910 on both the source and drain sides of LDMOS transistor 900. In this document, "substantially symmetrical" mean symmetrical within plus or minus ten percent.

Silicon semiconductor structure 902 includes a p-type substrate 930, an n-well 932, a p-body 934, a source p+ region 936, a source n+ region 938, and a drain n+ region 940. Source p+ region 936 has a greater p-type dopant concentration than p-body 934, and each of source and drain n+ regions 938 and 940 has a greater n-type dopant concentration than n-well 932. N-well 932 is formed on substrate 930, and p-body 934 is formed in n-well 932. Drain n+ region 938 is formed in n-well 932, and each of source p+ region 936 and source n+ region 938 is formed in p-body 934. Drain n+ region 940 is separated from source n+ region 938 in the lateral 924 direction. One or more regions of silicon semiconductor structure 902 optionally has a graded dopant concentration. For example, in some embodiments, n-well 932 has a graded n-type dopant concentration where n-type dopant concentration is greatest near drain n+ region 940, and p-body 934 has a graded p-type dopant concentration where p-type dopant concentration is greatest near source n+ region 938. P-type substrate 930 could be replaced with a different type of substrate, such as an n-type substrate or an intrinsic substrate, without departing from the scope hereof. Silicon semiconductor 902 can include additional impurity regions without departing from the scope hereof.

Source electrode 904 contacts each of source p+ region 936 and source n+ region 938. Gate electrode 906 contacts gate conductor 912, and drain electrode 908 contacts drain n+ region 940. Source electrode 904 and drain electrode 908 are each disposed on first outer surface 922 of silicon semiconductor structure 902. Gate conductor 912 is formed, for example, of polysilicon, and dielectric layer 910 is formed, for example, of silicon dioxide.

When positive voltage $V_{DS}$ is applied across drain electrode 908 and source electrode 904, a p-n junction formed at the interface of n-well 932 and p-body 934 is reversed biased, so that very little current flows between drain electrode 908 and source electrode 904 by default. However, a positive voltage $V_{GS}$ applied between gate electrode 906 and source electrode 904 creates negative charges in silicon semiconductor structure 902 around gate conductor 912, causing a minority-carrier channel to form in a region 942 of p-body 934. The channel has excess electrons and therefore conducts electric current through p-body 934 from n-well 932 to source n+ region 938. Consequentially, current will flow through silicon semiconductor structure 902 from drain n+ region 940 to source n+ region 938 when $V_{GS}$ exceeds a threshold value $V_{th}$ and $V_{DS}$ is a positive value.

Threshold value $V_{th}$ is established, in part, by the dopant concentration in p-body 934 and by the lateral 924 thickness of dielectric layer 910 separating gate conductor 912 from p-body 934. For example, threshold voltage $V_{th}$ can be reduced by decreasing p-type dopant concentration in p-body 934 adjacent to gate conductor 912 and/or by decreasing thickness of dielectric layer 910 between gate conductor 912 and p-body 934. Source p+ region 936 forms an ohmic contact between p-body 934 and source electrode 904 to help prevent a parasitic bipolar junction transistor (not shown) in silicon semiconductor substrate 902 from activating.

Possible applications of LDMOS transistor 900 include, but are not limited to, switching power converter applications. For example, each of LDMOS transistors 200(1) and 200(2) in buck converter 300 of FIG. 3 could be replaced with a respective instance of LDMOS transistor 900, with first and second bias circuitry 314 and 318 omitted since LDMOS transistor 900 does not include a second gate structure.

Applicant has further developed quasi-trench LDMOS transistors, where the drain region is at about the same height as the bottom of the gate region. This configuration potentially achieves lower on-resistance than full-trench configurations, with the potential tradeoff of potentially greater manufacturing complexity.

Figure 10:
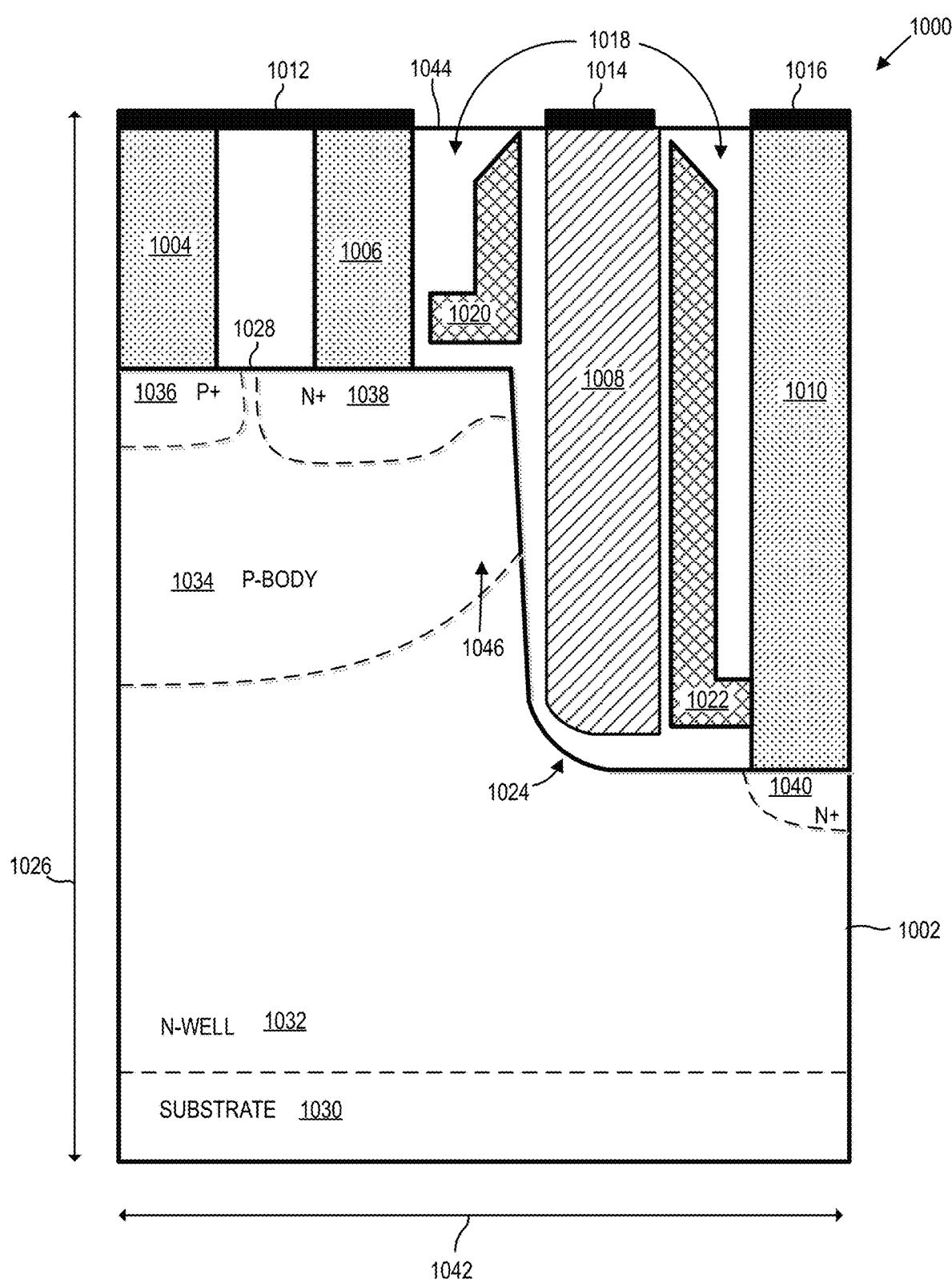
FIG. 10 is a cross-sectional view of a quasi-trench LDMOS transistor, according to an embodiment.

For example, FIG. 10 is a cross-sectional view of a quasi-trench LDMOS transistor 1000 including a silicon semiconductor structure 1002, a body conductive plug 1004, a source conductive plug 1006, a gate conductor 1008, a drain conductive plug 1010, a source electrode 1012, a gate electrode 1014, a drain electrode 1016, a dielectric layer 1018, and spacers 1020 and 1022. A trench 1024 is formed in silicon semiconductor structure 1002 in a thickness 1026 direction such that silicon semiconductor structure 1002 has a stepped first outer surface 1028.

Silicon semiconductor structure 1002 includes a p-type substrate 1030, an n-well 1032, a p-body 1034, a source p+ region 1036, a source n+ region 1038, and a drain n+ region 1040. Source p+ region 1036 has a greater p-type dopant concentration than p-body 1034, and each of source and drain n+ regions 1038 and 1040 has a greater n-type dopant concentration than n-well 1032. N-well 1032 is formed on substrate 1030, and p-body 1034 is formed in n-well 1032. Drain n+ region 1040 is formed in n-well 1032, and each of source p+ region 1036 and source n+ region 1038 is formed in p-body 1034. Drain n+ region 1040 is separated from source n+ region 1038 in a lateral 1042 direction, where the lateral 1042 direction is orthogonal to the thickness 1026 direction. P-type substrate 1030 could be replaced with a different type of substrate, such as an n-type substrate or an intrinsic substrate, without departing from the scope hereof. Silicon semiconductor structure 1002 can include additional impurity regions without departing from the scope hereof.

One or more regions of silicon semiconductor structure 1002 optionally has a graded dopant concentration. For example, in some embodiments, n-well 1032 has a graded n-type dopant concentration where n-type dopant concentration is greatest near drain n+ region 1040, and p-body 1034 has a graded p-type dopant concentration where p-type dopant concentration is greatest near source n+ region 1038.

Dielectric layer 1018 is disposed on first outer surface 1028 of silicon semiconductor structure 1002 in the thickness 1026 direction, and dielectric layer 1018 has an outer surface 1044 away from silicon semiconductor structure 1002. In some embodiments, outer surface 1044 of dielectric layer 1018 is at least substantially planar. Body conductive plug 1004 extends through dielectric layer 1018 in the thickness 1026 direction to contact source p+ region 1036, and source conductive plug 1006 extends through dielectric layer 1018 in the thickness 1026 direction to contact source n+ region 1038. Gate conductor 1008 is embedded in dielectric layer 1018 and extends into trench 1024 in the thickness 1026 direction. Gate conductor 1008 is separated from silicon semiconductor structure 1002 by dielectric layer 1018. Drain conductive plug 1010 extends through dielectric layer 1018 and trench 1024 to contact drain n+ region 1040.

Source electrode 1012 contacts each of body conductive plug 1004 and source conductive plug 1006. Gate electrode 1014 contacts gate conductor 1008, and drain electrode 1016 contacts drain conductive plug 1010. Spacer 1020 laterally 1042 separates gate conductor 1008 from source conductive plug 1006, and spacer 1022 laterally 1042 separates gate conductor 1008 from drain conductive plug 1010. Each of body conductive plug 1004, source conductive plug 1006, and drain conductive plug 1010 is formed of metal, for example. Gate conductor 1008 is formed, for example, of polysilicon, and dielectric layer 1018 is formed, for example, of silicon dioxide.

When positive voltage $V_{DS}$ is applied across drain electrode 1016 and source electrode 1012, a p-n junction formed at the interface of n-well 1032 and p-body 1034 is reversed biased, so that very little current flows between drain electrode 1016 and source electrode 1012 by default. However, a positive voltage $V_{GS}$ applied between gate electrode 1014 and source electrode 1012 creates negative charges in silicon semiconductor structure 1002 around gate conductor 1008, causing a minority-carrier channel to form in a region 1046 of p-body 1034. This channel has excess electrons and therefore conducts electric current through p-body 1034 from n-well 1032 to source n+ region 1038. Consequentially, current will flow through silicon semiconductor structure 1002 from drain n+ region 1040 to source n+ region 1038 when $V_{GS}$ exceeds a threshold value $V_{th}$ and $V_{DS}$ is a positive value.

It should be appreciated that the distance current must flow through n-well 1032 is relatively short due to the quasi-trench configuration of LDMOS transistor 1000. In particular, current only needs to flow along one side and the bottom of gate conductor 1008, in LDMOS transistor 1000. This relatively short current path promotes low on-resistance. In full-trench devices, in contrast, current needs to flow along two sides, as well as the bottom, of the gate conductor.

Threshold value $V_{th}$ is established, in part, by the dopant concentration in p-body 1034 and by the lateral 1042 thickness of dielectric layer 1018 separating gate conductor 1008 from p-body 1034. For example, threshold voltage $V_{th}$ can be reduced by decreasing p-type dopant concentration in p-body 1034 adjacent to gate conductor 1008 and/or by decreasing thickness of dielectric layer 1018 between gate conductor 1008 and p-body 1034. Source p+ region 1036 forms an ohmic contact between p-body 1034 and body conductive plug 1004 to help prevent a parasitic bipolar junction transistor (not shown) in silicon semiconductor substrate 1002 from activating.

Possible applications of LDMOS transistor 1000 include, but are not limited to, switching power converter applications. For example, each of LDMOS transistors 200(1) and 200(2) in buck converter 300 of FIG. 3 could be replaced with a respective instance of LDMOS transistor 1000, with first and second bias circuitry 314 and 318 omitted since LDMOS transistor 1000 does not include a second gate structure.

Figure 11:
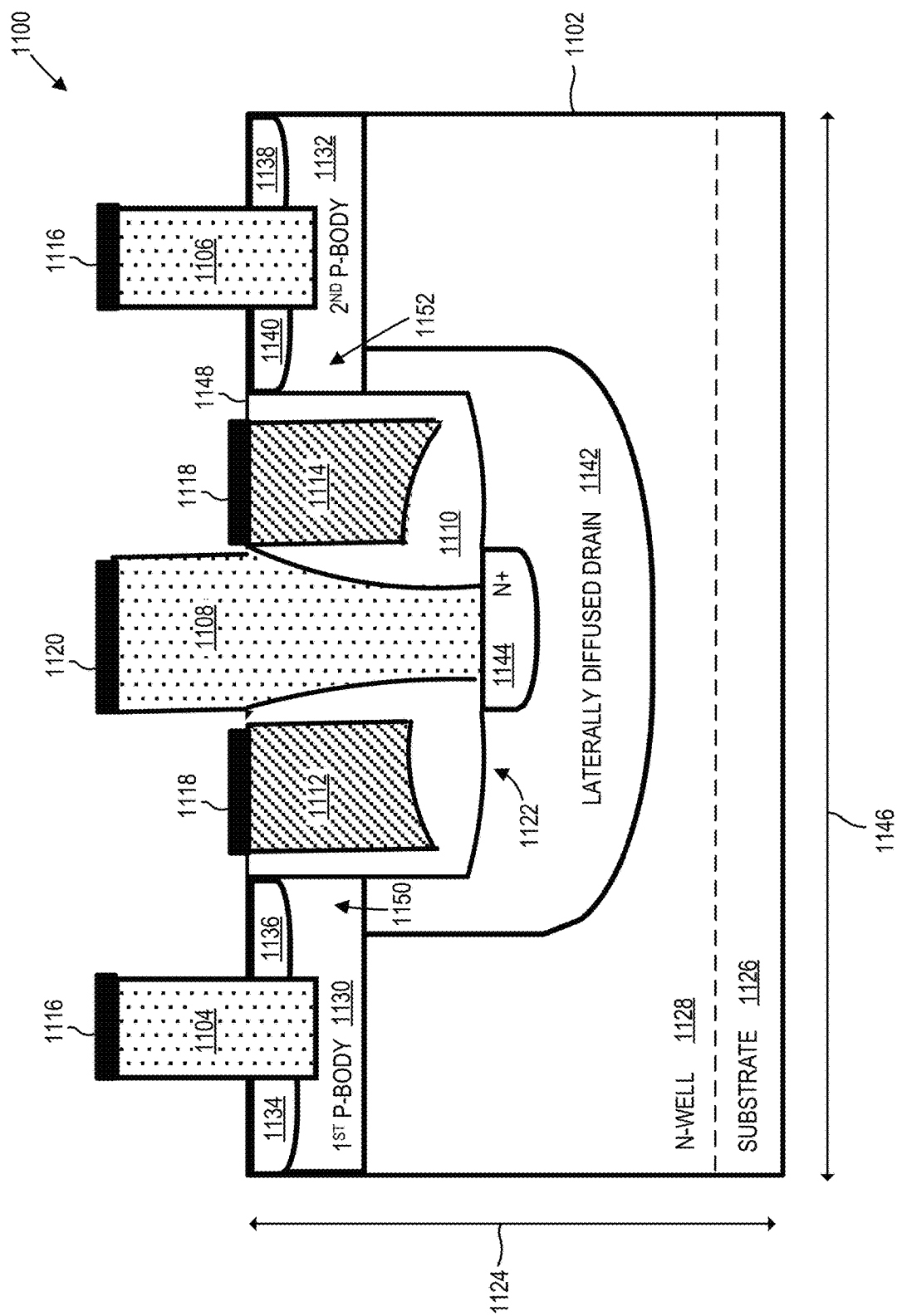
FIG. 11 is a cross-sectional view of a LDMOS transistor including two source regions, according to an embodiment.

FIG. 11 is a cross-sectional view of a LDMOS transistor 1100 including two source regions. LDMOS transistor 1100 includes a silicon semiconductor structure 1102, a first source conductive plug 1104, a second source conductive plug 1106, a drain conductive plug 1108, a dielectric layer 1110, a first gate conductor 1112, a second gate conductor 1114, a source electrode 1116, a gate electrode 1118, and a drain electrode 1120. A trench 1122 is formed in silicon semiconductor structure 1102 in a thickness 1124 direction, and dielectric layer 1110 is disposed in trench 1122.

Silicon semiconductor structure 1102 includes a p-type substrate 1126, an n-well 1128, a first p-body 1130, a second p-body 1132, a first source p+ region 1134, a first source n+ region 1136, a second source p+ region 1138, a second source n+ region 1140, an n-type laterally diffused drain 1142, and a drain n+ region 1144. First source p+ region 1134 has a greater p-type dopant concentration than first p-body 1130, and second source p+ region 1138 has a greater p-type dopant concentration than second p-body 1132. Each of first source n+ region 1136, second source n+ region 1140, and drain n+ region 1144 has a greater n-type dopant concentration than n-type laterally diffused drain 1142, and n-type laterally diffused drain 1142 has a greater n-type dopant concentration than n-well 1128.

N-well 1128 is formed on substrate 1126. Each of first and second p-bodies 1130 and 1132 is formed in n-well 1128 and disposed in a lateral 1146 direction on opposite respective sides of trench 1122, where the lateral 1146 direction is orthogonal to the thickness 1124 direction. First source p+ region 1134 and first source n+ region 1136 are formed in first p-body 1130 adjacent to a first outer surface 1148 of silicon semiconductor structure 1102. Second source p+ region 1138 and second source n+ region 1140 are formed in second p-body 1132 adjacent to first outer surface 1148. N-type laterally diffused drain 1142 is formed in n-well 1128 and partially surrounds trench 1122. Drain n+ region 1144 is formed in n-type lateral diffused drain 1142 below trench 1122 in the thickness 1124 direction, and drain region 1144 is laterally 1146 separated from each of first p-body 1130 and second p-body 1132. One or more regions of silicon semiconductor structure 1102 optionally have a graded dopant concentration. P-type substrate 1126 could be replaced with a different type of substrate, such as an n-type substrate or an intrinsic substrate, without departing from the scope hereof. Silicon semiconductor structure 1102 can include additional impurity regions without departing from the scope hereof.

Drain conductive plug 1108 extends through dielectric layer 1110 and trench 1122 in the thickness 1124 direction to contact drain n+ region 1144. First source conductive plug 1104 extends along each of first source p+ region 1134 and first source n+ region 1136 in the thickness 1124 direction to contact first p-body 1130. This configuration promotes small device pitch by using a single conductive plug to contact each of first source n+ region 1136 and first p-body 1130. Similarly, second source conductive plug 1106 extends along each of second source p+ region 1138 and second source n+ region 1140 in the thickness 1124 direction to contact second p-body 1132, thereby also promoting small device pitch by using a single conductive plug to contact each of source n+ region 1140 and second p-body 1132. Each of first and second gate conductors 1112 and 1114 is embedded in dielectric layer 1110 and extends into trench 1122 in the thickness 1124 direction, and first and second gate conductors 1112 and 1114 are laterally 1146 disposed on opposite respective sides of drain conductive plug 1108. Each of first gate conductor 1112 and second gate conductor 1114 is separated from silicon semiconductor structure 1102 by dielectric layer 1110.

Source electrode 1116 contacts each of first source conductive plug 1104 and second source conductive plug 1106. Gate electrode 1118 contacts each of first gate conductor 1112 and second gate conductor 1114. Drain electrode 1120 contacts drain conductive plug 1108. Each of first source conductive plug 1104, second source conductive plug 1106, and drain conductive plug 1108 is formed of metal, for example. First and second gate conductors 1112 and 1114 are each formed, for example, of polysilicon, and dielectric layer 1110 is formed, for example, of silicon dioxide.

When positive voltage $V_{DS}$ is applied across drain electrode 1120 and source electrode 1116, a p-n junctions formed at each of (a) the interface of n-well 1128 and first p-body 1130, (b) the interface of n-type laterally diffused drain 1142 and first p-body 1130, (c) the interface of n-well 1128 and second p-body 1132, and (d) the interface of n-type laterally diffused drain 1142 and second p-body 1132 are reversed biased, so that very little current flows between drain electrode 1120 and source electrode 1116 by default. However, a positive voltage $V_{GS}$ applied between gate electrode 1118 and source electrode 1116 creates negative charges in silicon semiconductor structure 1102 around each of first and second gate conductors 1112 and 1114, causing a respective minority-carrier channel to form in each of a region 1150 of first p-body 1130 and a region 1152 of second p-body 1132. Each channel has excess electrons and therefore conducts electric current through its respective p-body 1130 or 1132. Consequentially, current will flow through silicon semiconductor structure 1102 from drain n+ region 1144 to each of first and second source n+ regions 1136 and 1140 when $V_{GS}$ exceeds a threshold value $V_{th}$ and $V_{DS}$ is a positive value. Threshold value $V_{th}$ is established, in part, by the dopant concentration in each of first p-body 1130 and second p-body 1132, as well as the lateral 1146 thickness of dielectric layer 1110 separating first and second gate conductors 1112 and 1114 from first and second p-bodies 1130 and 1132, respectively.

That LMDOS transistor 1100 has two source regions promotes low on-resistance by providing two parallel paths for current flow. However, lateral 1146 dimensions of first and second gate conductors 1112 and 1114 must be relatively large to obtain high breakdown voltage, resulting in LDMOS transistor 1100 having a relatively large pitch at high breakdown voltage ratings.

Possible applications of LDMOS transistor 1100 include, but are not limited to, switching power converter applications. For example, each of LDMOS transistors 200(1) and 200(2) in buck converter 300 of FIG. 3 could be replaced with a respective instance of LDMOS transistor 1100, with first and second bias circuitry 314 and 318 omitted since LDMOS transistor 1100 does not include a second gate structure.

Figure 12:
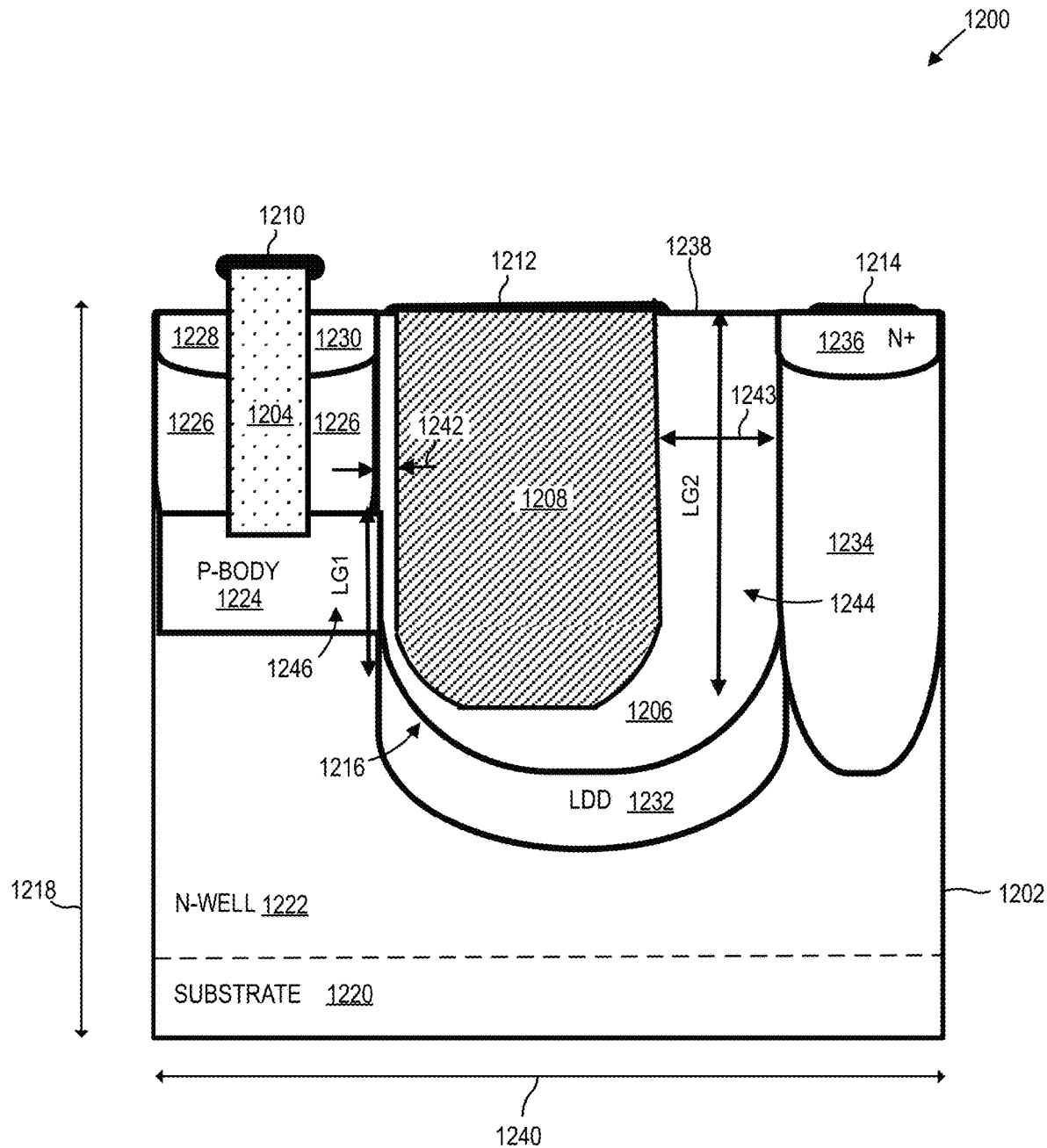
FIG. 12 is a cross-sectional view of a LDMOS transistor including two drift regions, according to an embodiment.

FIG. 12 is a cross-sectional view of a LDMOS transistor 1200 including a plurality of drift regions. LDMOS transistor 1200 includes a silicon semiconductor structure 1202, a source conductive plug 1204, a dielectric layer 1206, a gate conductor 1208, a source electrode 1210, a gate electrode 1212, and a drain electrode 1214. A trench 1216 is formed in silicon semiconductor structure 1202 in a thickness 1218 direction, and dielectric layer 1206 is disposed in trench 1216.

Silicon semiconductor structure 1202 includes a p-type substrate 1220, an n-well 1222, a p-body 1224, a first n-type drift region 1226, a source p+ region 1228, a source n+ region 1230, an n-type laterally diffused drain 1232, a second n-type drift region 1234, and a drain n+ region 1236. Source p+ region 1228 has a greater p-type dopant concentration than p-body 1224. Each of source n+ region 1230 and drain n+ region 1236 has a greater n-type dopant concentration than n-type laterally diffused drain 1232, and n-type laterally diffused drain 1232 has a greater n-type dopant concentration than each of first and second n-type drift regions 1226 and 1234. Each of first and second n-type drift regions 1226 and 1234, in turn, has a greater n-type dopant concentration than n-well 1222.

N-well 1222 is formed on substrate 1220. P-body 1224 is formed in n-well 1222 and is adjacent to trench 1216 in a lateral 1240 direction, where the lateral 1240 direction is orthogonal to the thickness 1218 direction. Source p+ region 1228 and source n+ region 1230 are formed in p-body 1224 adjacent to a first outer surface 1238 of silicon semiconductor structure 1202. Source p+ region 1228 and source n+ region 1230 are also laterally 1240 adjacent to each other. First n-type drift region 1226 is disposed below each of source p+ region 1228 and source n+ region 1230 in the thickness 1218 direction. N-type laterally diffused drain 1232 is disposed below trench 1216 in the thickness 1218 direction. Second n-type drift region 1234 is formed in n-well 1222 such that first and second n-type drift regions 1226 and 1234 are disposed on opposite respective sides of trench 1216 in the lateral 1240 direction. Drain n+ region 1236 is disposed in second n-type drift region 1234 adjacent to first outer surface 1238 of silicon semiconductor structure 1202. Drain n+ region 1236 is separated from source n+ region 1230 in the lateral 1240 direction. One or more regions of silicon semiconductor structure 1202 optionally have a graded dopant concentration. P-type substrate 1220 could be replaced with a different type of substrate, such as an n-type substrate or an intrinsic substrate, without departing from the scope hereof. Silicon semiconductor structure 1202 can include additional impurity regions without departing from the scope hereof.

Source conductive plug 1204 extends along each of source p+ region 1228 and source n+ region 1230 and through first n-type drift region 1226 in the thickness 1218 direction to contact p-body 1224. Gate conductor 1208 is embedded in dielectric layer 1206 and extends into trench 1216 in the thickness 1218 direction, and gate conductor 1212 is separated from silicon semiconductor structure 1202 by dielectric layer 1206. A lateral separation distance 1242 between gate conductor 1208 and first n-type drift region 1226 is less than a lateral separation distance 1243 between gate conductor 1208 and second n-type drift region 1234. A portion 1244 of dielectric layer 1206 between gate conductor 1208 and second n-type drift region 1234 achieves a reduced surface field effect, thereby enabling second drift region 1234 to have a relatively high n-type dopant concentration to promote low on-resistance of LDMOS transistor 1200, without diminishing breakdown voltage of the transistor.

Source electrode 1210 contacts source conductive plug 1204, and gate electrode 1212 contacts gate conductor 1208. Drain electrode 1214 contacts drain n+ region 1236. Source conductive plug 1204 is formed of metal, for example. Gate conductor 1208 is formed, for example, of polysilicon, and dielectric layer 1206 is formed, for example, of silicon dioxide.

When positive voltage $V_{DS}$ is applied across drain electrode 1214 and source electrode 1210, a p-n junction formed at the interface of n-well 1222 and p-body 1224 is reversed biased, so that very little current flows between drain electrode 1214 and source electrode 1210 by default. However, a positive voltage $V_{GS}$ applied between gate electrode 1212 and source electrode 1210 creates negative charges in silicon semiconductor structure 1202 around gate conductor 1208, causing a minority-carrier channel to form in a region 1246 of p-body 1224. This channel has excess electrons and therefore conducts electric current through p-body 1224. Consequentially, current will flow through silicon semiconductor structure 1202 from drain n+ region 1236 to source n+ region 1230 when $V_{GS}$ exceeds a threshold value $V_{th}$ and $V_{DS}$ is a positive value. Threshold value $V_{th}$ is established, in part, by the dopant concentration in p-body 1224 and by the lateral 1240 thickness of dielectric layer 1206 separating gate conductor 1208 from p-body 1224.

That LMDOS transistor 1200 includes two drift regions, i.e., first n-type drift region 1226 and second n-type drift region 1234, helps enable optimization of LDMOS transistor 1200 by allowing gate dimensions LG1 and LG2 to be independently defined. In particular, LG1 is primarily defined by first n-type drift region 1226, and LG2 is primarily defined by second n-type drift region 1234. A desired breakdown voltage of LDMOS transistor 1200 is obtained, for example, by optimizing dimension LG2 during the design of LDMOS transistor 1200. First and second n-type drift regions 1226 and 1234 are formed in separate process steps in some embodiments.

Possible applications of LDMOS transistor 1200 include, but are not limited to, switching power converter applications. For example, each of LDMOS transistors 200(1) and 200(2) in buck converter 300 of FIG. 3 could be replaced with a respective instance of LDMOS transistor 1200, with first and second bias circuitry 314 and 318 omitted since LDMOS transistor 1200 does not include a second gate structure.

Figure 13:
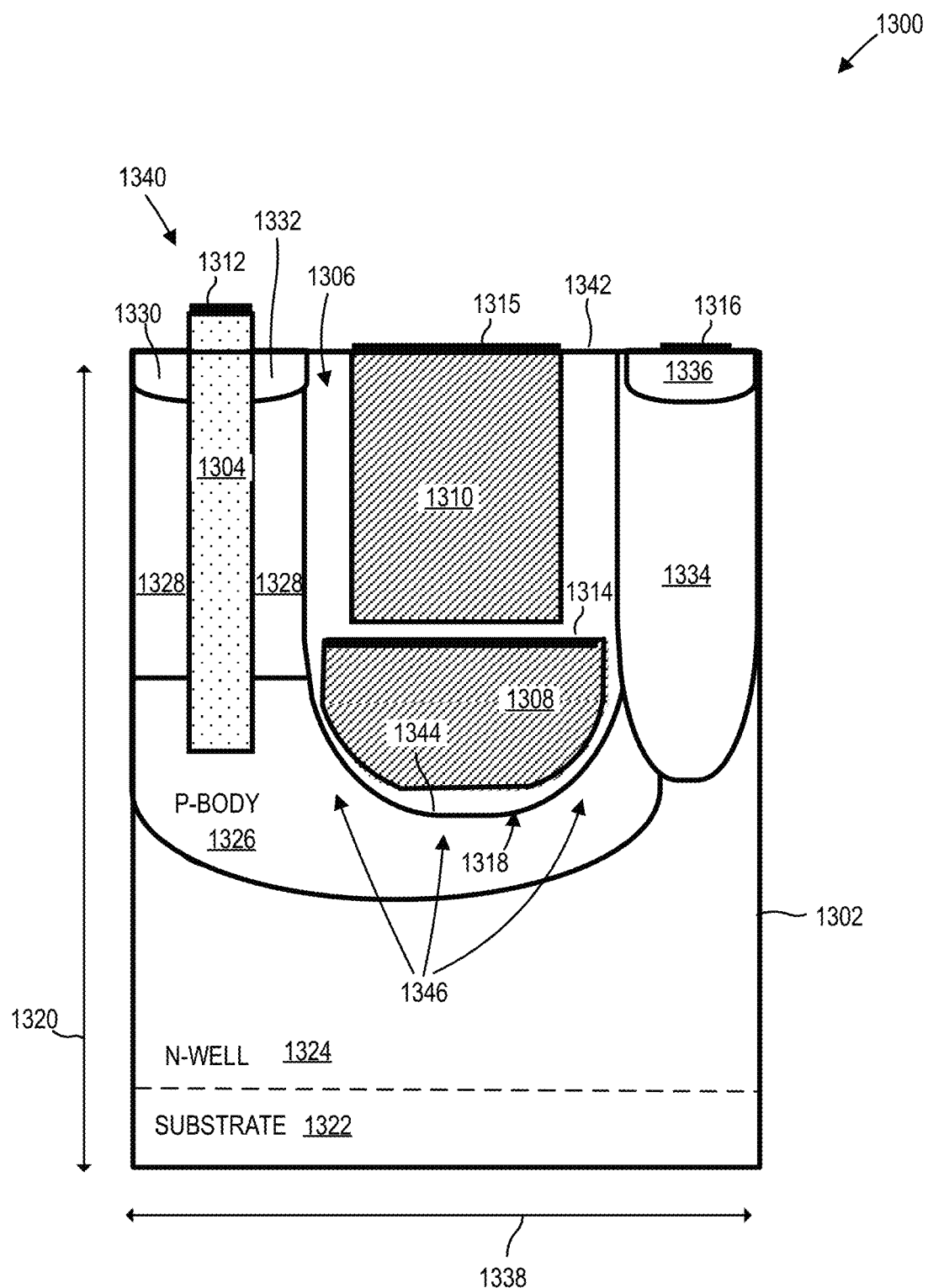
FIG. 13 is a cross-sectional view of a LDMOS transistor including two gate conductors in a trench, according to an embodiment.

FIG. 13 is a cross-sectional view of a LDMOS transistor 1300 including two gate conductors in a trench. LDMOS transistor 1300 includes a silicon semiconductor structure 1302, a source conductive plug 1304, a dielectric layer 1306, a first gate conductor 1308, a second gate conductor 1310, a source electrode 1312, a first gate electrode 1314, a second gate electrode 1315, and a drain electrode 1316. A trench 1318 is formed in silicon semiconductor structure 1302 in a thickness 1320 direction, and dielectric layer 1306 is disposed in trench 1318.

Silicon semiconductor structure 1302 includes a p-type substrate 1322, an n-well 1324, a p-body 1326, a first n-type drift region 1328, a source p+ region 1330, a source n+ region 1332, a second n-type drift region 1334, and a drain n+ region 1336. Source p+ region 1330 has a greater p-type dopant concentration than p-body 1326. Each of source n+ region 1332 and drain n+ region 1336 has a greater n-type dopant concentration than each of first and second n-type drift regions 1328 and 1334. Each of first and second n-type drift regions 1328 and 1334, in turn, has a greater n-type dopant concentration than n-well 1324.

N-well 1324 is formed on substrate 1322. P-body 1326 is formed in n-well 1324 below trench 1318 in the thickness 1320 direction. Additionally, p-body 1326 is adjacent to trench 1318 in a lateral 1338 direction in a source region 1340 of LDMOS transistor 1300, where the lateral 1338 direction is orthogonal to the thickness 1320 direction. Source p+ region 1330 and source n+ region 1332 are each formed in p-body 1326 adjacent to a first outer surface 1342 of silicon semiconductor structure 1302. Source p+ region 1330 and source n+ region 1332 are also laterally 1338 adjacent to each other. First n-type drift region 1328 is disposed below each of source p+ region 1330 and source n+ region 1332 in the thickness 1320 direction. Second n-type drift region 1334 is formed in n-well 1324 such that first and second n-type drift regions 1328 and 1334 are disposed on opposite respective sides of trench 1318 in the lateral 1338 direction. Drain n+ region 1336 is disposed in second n-type drift region 1334 adjacent to first outer surface 1342 of silicon semiconductor structure 1302. One or more regions of silicon semiconductor structure 1302 optionally have graded dopant concentrations. P-type substrate 1322 could be replaced with a different type of substrate, such as an n-type substrate or an intrinsic substrate, without departing from the scope hereof. Silicon semiconductor structure 1302 can include additional impurity regions without departing from the scope hereof.

Source conductive plug 1304 extends along each of source p+ region 1330 and source n+ region 1332 and through first n-type drift region 1328 in the thickness 1320 direction to contact p-body 1326. Each of first and second gate conductors 1308 and 1310 is embedded in dielectric layer 1306 and extends into trench 1318 in the thickness 1320 direction. Second gate conductor 1310 is disposed above first gate conductor 1308 in the thickness 1320 direction in trench 1318, such that first gate conductor 1308 is closer to a bottom 1344 of trench 1318 than second gate conductor 1310. First and second gate conductors 1308 and 1310 are separated from each other, as well as from silicon semiconductor structure 1302, by dielectric layer 1306.

Source electrode 1312 contacts source conductive plug 1304. First gate electrode 1314 contacts first gate conductor 1308, and second gate electrode 1315 contacts second gate conductor 1310. Drain electrode 1316 contacts drain n+ region 1336. Source conductive plug 1304 is formed of metal, for example. Each of first and second gate conductors 1308 and 1310 is formed, for example, of polysilicon, and dielectric layer 1306 is formed, for example, of silicon dioxide.

When positive voltage $V_{DS}$ is applied across drain electrode 1316 and source electrode 1312, p-n junctions formed at each of the interfaces of (a) n-well 1324 and p-body 1326 and (b) second n-type drift region 1334 and p-body 1326 are reversed biased, so that very little current flows between drain electrode 1316 and source electrode 1312 by default. However, a positive voltage $V_{GS}$ applied between first gate electrode 1314 and source electrode 1312 creates negative charges in silicon semiconductor structure 1302 around first gate conductor 1308, causing a minority-carrier channel to form in a region 1346 of p-body 1326. This channel has excess electrons and therefore conducts electric current through p-body 1326. Consequentially, current will flow through silicon semiconductor structure 1302 from drain n+ region 1336 to source n+ region 1332 when $V_{GS}$ exceeds a threshold value $V_{th}$ and $V_{DS}$ is a positive value. Threshold value $V_{th}$ is established, in part, by the dopant concentration in p-body 1326 and by the thickness of dielectric layer 1306 separating first gate conductor 1308 from p-body 1326.

Second gate conductor 1310 can advantageously be used to promote both low on-resistance and high breakdown of LDMOS transistor 1300. In particular, a positive bias voltage can be applied to second gate electrode 1315 relative to source electrode 1312 to cause negative charges to collect in each of first and second n-type drift regions 1328 and 1334 adjacent to second gate conductor 1310. These negative charges create respective majority-carrier channels in each of first and second n-type drift regions 1328 and 1334 adjacent to second gate conductor 1310, to promote low resistance in the current path through each n-type drift region. Additionally, applying a positive bias voltage to second gate electrode 1315 reduces potential difference between drain n+ region 1336 and second gate conductor 1310, thereby promoting high breakdown voltage of LDMOS transistor 1300. A constant bias voltage is optionally applied to second gate electrode 1315, i.e., bias voltage on second gate electrode 1315 remains constant even as voltage on first gate electrode 1314 changes during switching of LDMOS transistor 1300, to promote low switching losses in LDMOS transistor 1300 and simplicity of circuitry (not shown) biasing second gate electrode 1315.

Possible applications of LDMOS transistor 1300 include, but are not limited to, switching power converter applications. For example, each of LDMOS transistors 200(1) and 200(2) in buck converter 300 of FIG. 3 could be replaced with a respective instance of LDMOS transistor 1300. LDMOS transistor 1300 could also be used with method 400 of FIG. 4.

A plurality of the LDMOS transistors disclosed herein could be formed on a common substrate. Such plurality of transistors need not necessarily have the same configuration. For example, an instance of LDMOS transistor 1000 of FIG. 10 and an instance of LDMOS transistor 1100 of FIG. 11 could be formed on a common p-type substrate. As another example, an instance of LDMOS transistor 1200 of FIG. 12 and an instance of LDMOS transistor 1300 of FIG. 13 could be formed on a common substrate.

Combinations of Features

Features described above may be combined in various ways without departing from the scope hereof. The following examples illustrate some possible combinations:

(A1) A lateral double-diffused metal-oxide-semiconductor field effect (LDMOS) transistor may include a silicon semiconductor structure, first and second gate structures, and a trench dielectric layer. The first and second gate structures may be disposed on the silicon semiconductor structure and separated from each other in a lateral direction. The trench dielectric layer may be disposed in a trench in the silicon semiconductor structure and extend at least partially under each of the first and second gate structures in a thickness direction orthogonal to the lateral direction.

(A2) In the LDMOS transistor denoted as (A1), the silicon semiconductor structure may include a substrate, an n-well formed on the substrate, a p-body formed in the n-well, a source n+ region formed in the p-body, and a drain n+ region formed in the n-well. Additionally, the trench dielectric layer may be disposed between the p-body and the drain n+ region in the lateral direction.

(A3) In the LDMOS transistor denoted as (A2), the silicon semiconductor structure may further include a source p+ region formed in the p-body. The source p+ region may have a greater p-type dopant concentration than the p-body, and each of the source and drain n+ regions may have a greater n-type dopant concentration than the n-well.

(A4) In any of the LDMOS transistors denoted as (A2) through (A3), the p-body may extend under the trench dielectric layer in the thickness direction, and the p-body may have a graded p-type dopant concentration.

(A5) In any of the LDMOS transistors denoted as (A2) through (A4), the first gate structure may include a first gate dielectric layer and a first gate conductor stacked on a first outer surface of the silicon semiconductor structure in the thickness direction. Additionally, the second gate structure may include a second gate dielectric layer and a second gate conductor stacked on the first outer surface of the silicon semiconductor structure in the thickness direction.

(A6) In the LDMOS transistor denoted as (A5), each of the first and second gate conductors may be formed of polysilicon, and each of the first and second gate dielectric layers may be formed of silicon dioxide.

(A7) Any of the LDMOS transistors denoted as (A5) or (A6) may further include a source electrode disposed on the first outer surface of the silicon semiconductor structure and contacting each of the source p+ region and the source n+ region, a drain electrode disposed on the first outer surface of the silicon semiconductor structure and contacting the drain n+ region, a first gate electrode stacked on the first gate conductor, and a second gate electrode stacked on the second gate conductor.

(A8) A switching circuit may include the LDMOS transistor denoted as (A7), driver circuitry for repeatedly driving the first gate electrode between at least two different voltage magnitudes relative to the source electrode, and bias circuitry for maintaining the second gate electrode at a positive voltage relative to the source electrode.

(A9) In the switching circuit denoted as (A8), the bias circuitry may be configured to maintain the second gate electrode at a fixed positive voltage relative to the source electrode.

(B1) A lateral double-diffused metal-oxide-semiconductor field effect (LDMOS) transistor may include a silicon semiconductor structure, a first gate structure disposed on the silicon semiconductor structure, and a second gate structure partially disposed in a trench of the silicon semiconductor structure.

(B2) In the LDMOS transistor denoted as (B1), the silicon semiconductor structure may include a substrate, an n-well formed on the substrate, a p-body formed in the n-well, a source n+ region formed in the p-body, and a drain n+ region formed in the n-well. The first gate structure may be disposed on the silicon semiconductor structure at least partially over the p-body in a thickness direction, and the second gate structure may be disposed between the p-body and the drain n+ region in a lateral direction orthogonal to the thickness direction.

(B3) In the LDMOS transistor denoted as (B2), the silicon semiconductor structure may further include a source p+ region formed in the p-body.

(B4) In any of the LDMOS transistors denoted as (B2) and (B3), the p-body may extend deeper into the silicon semiconductor structure in the thickness direction than the second gate structure, and the p-body may have a graded p-type dopant concentration.

(B5) In any of the LDMOS transistors denoted as (B2) through (B4), the first gate structure may include a first gate dielectric layer and a first gate conductor stacked on a first outer surface of the silicon semiconductor substrate in the thickness direction, and the second gate structure may include a second gate conductor embedded in a second gate dielectric layer in the trench.

(B6) In the LDMOS transistor denoted as (B5), the second gate structure may further include a third gate conductor embedded in the second gate dielectric layer in the trench, and the second and third gate conductors may be separated from each other in the lateral direction.

(B7) In the LDMOS transistor denoted as (B6), the second gate conductor may be disposed between the p-body and the third gate conductor in the lateral direction, and the third gate conductor may be disposed between the second gate conductor and the drain n+ region in the lateral direction.

(B8) In any of the LDMOS transistors denoted as (B5) through (B7), each of the first and second gate conductors may be formed of polysilicon, and each of the first and second gate dielectric layers may be formed of silicon dioxide.

(B9) Any of the LDMOS transistors denoted as (B5) through (B8) may further include a source electrode disposed on the first outer surface of the silicon semiconductor structure and contacting the source n+ region, a drain electrode disposed on the first outer surface of the silicon semiconductor structure and contacting the drain n+ region, a first gate electrode stacked on the first gate conductor, and a second gate electrode stacked on the second gate conductor.

(B10) A switching circuit may include the LDMOS transistor denoted as (B9), driver circuitry for repeatedly driving the first gate electrode between at least two different voltage magnitudes relative to the source electrode, and bias circuitry for maintaining the second gate electrode at a positive voltage relative to the source electrode.

(B11) In the switching circuit denoted as (B10), the bias circuitry may be configured to maintain the second gate electrode at a fixed positive voltage relative to the source electrode.

(C1) A lateral double-diffused metal-oxide-semiconductor field effect (LDMOS) transistor may include a silicon semiconductor structure including a substrate, an n-well formed on the substrate, a p-body formed in the n-well below a trench in the silicon semiconductor substrate in a thickness direction, where the p-body is additionally adjacent to the trench in a lateral direction in a source region of the LDMOS transistor, the lateral direction being orthogonal to the thickness direction, a first n-type drift region formed in the p-body, and a second n-type drift region formed in the n-well such that the first and second n-type drift regions are disposed on opposite respective sides of the trench in the lateral direction. The LDMOS transistor may further include a dielectric layer disposed in the trench and first and second gate conductors embedded in the dielectric layer and extending into the trench in the thickness direction. The second gate conductor may be disposed above the first gate conductor in the thickness direction.

(C2) In the LDMOS transistor denoted as (C1), the silicon semiconductor structure may further include a source p+ region and a source n+ region formed in the p-body, the source p+ region and the source n+ region being adjacent in the lateral direction, and a drain n+ region formed in the second drift region. Additionally, the first n-type drift region may be formed in the p-body below each of the source p+ region and the source n+ region in the thickness direction.

(C3) In LDMOS transistor denoted as (C2), the source p+ region may have a greater p-type dopant concentration than the p-body, each of the source n+ region and the drain n+ region may have a greater n-type dopant concentration than each of the first and second n-type drift regions, and each of the first and second n-type drift regions may have a greater n-type dopant concentration than the n-well.

(C4) In any of the LDMOS transistors denoted as (C2) through (C3), each of the first and second gate conductors may be formed of polysilicon, and the dielectric layer may be formed of silicon dioxide.

(C5) Any of the LDMOS transistors denoted as (C2) through (C4) may further include a source conductive plug extending along each of the source p+ region and the source n+ region and through the first n-type drift region in the thickness direction, to contact the p-body.

(C6) In the LDMOS transistor denoted as (C5), the first and second gate conductors may be separated from the silicon semiconductor structure by the dielectric layer.

(C7) In any of the LDMOS transistors denoted as (C5) through (C6), the dielectric layer may separate each of the two gate conductors in the thickness direction.

(C8) In any of the LDMOS transistors denoted as (C5) through (C7), the first gate conductor may be disposed closer to a bottom of the trench than the second gate conductor.

(C9) Any of the LDMOS transistors denoted as (C5) through (C8) may further include a source electrode contacting the source conductive plug, a first gate electrode contacting the first gate conductor, a second gate electrode contacting the second gate conductor, and a drain electrode contacting the drain n+ region.

(C10) A switching circuit may include the LDMOS transistor denoted as (C9), driver circuitry for repeatedly driving the first gate electrode between at least two different voltage magnitudes relative to the source electrode, and bias circuitry for maintaining the second gate electrode at a positive voltage relative to the source electrode.

(C11) In the switching circuit denoted as (C10), the bias circuitry may be configured to maintain the second gate electrode at a fixed positive voltage relative to the source electrode.

(D1) A method for reducing on-resistance in a lateral double-diffused metal-oxide-semiconductor field effect (LDMOS) transistor may include (1) repeatedly switching a first gate electrode between at least two different voltage magnitudes relative to a source electrode of the LDMOS transistor to repeatedly create and destroy a minority-carrier channel in a p-body of the LDMOS transistor and (2) maintaining a second gate electrode at a positive voltage relative to the source electrode to create a majority-carrier channel in an n-doped portion of the LDMOS transistor.

(D2) In the method denoted as (D1), the n-doped portion of the LDMOS transistor may be an n-well.

(D3) In the method denoted as (D1), the n-doped portion of the LDMOS transistor may be an n-type drift region.

(D4) In any of the methods denoted as (D1) through (D3), the step of maintaining may include maintaining the second gate electrode at a fixed voltage relative to the source electrode.

(E1) A lateral double-diffused metal-oxide-semiconductor field effect (LDMOS) transistor may include a silicon semiconductor structure including a substrate, an n-well formed on the substrate, a p-body formed in the n-well, a source n+ region formed in the p-body, and a drain n+ region formed in the n-well and separated from the source n+ region in a lateral direction. The LDMOS transistor may further include a dielectric layer at least partially disposed in a trench of the silicon semiconductor structure in a thickness direction and a gate conductor embedded in the dielectric layer and extending into the trench in the thickness direction. The dielectric layer and the gate conductor may be at least substantially symmetric with respect to a center axis of the trench extending in the thickness direction, as seen when the LDMOS transistor is viewed cross-sectionally in a direction orthogonal to the lateral and thickness directions.

(E2) In the LDMOS transistor denoted as (E1), the silicon semiconductor structure may further include a source p+ region formed in the p-body.

(E3) In the LDMOS transistor denoted as (E2), the source p+ region may have a greater p-type dopant concentration than the p-body and each of the source and drain n+ regions may have a greater n-type dopant concentration than the n-well.

(E4) In any of the LDMOS transistors denoted as (E2) and (E3), the gate conductor may be formed of polysilicon, and the dielectric layer may be formed of silicon dioxide.

(E5) Any of the LDMOS transistors denoted as (E2) through (E4) may further include a source electrode contacting each of the source p+ region and the source n+ region, a gate electrode contacting the gate conductor, and a drain electrode contacting the drain n+ region.

(E6) A switching circuit may include the LDMOS transistor denoted as (E5) and driver circuitry for repeatedly driving the gate electrode between at least two different voltage magnitudes relative to the source electrode.

(F1) A lateral double-diffused metal-oxide-semiconductor field effect (LDMOS) transistor may include a silicon semiconductor structure including a substrate, an n-well formed on the substrate, a p-body formed in the n-well, a source n+ region formed in the p-body, and a drain n+ region formed in the n-well and separated from the source n+ region in a lateral direction. The LDMOS transistor may further include a dielectric layer formed on the silicon semiconductor structure in a thickness direction orthogonal to the lateral direction, a gate conductor embedded in the dielectric layer and extending into a trench of the silicon semiconductor substrate in the thickness direction, and a drain conductive plug extending through the dielectric layer and the trench in the thickness direction to contact the drain n+ region.

(F2) In the LDMOS transistor denoted as (F1), the gate conductor may be formed of polysilicon, and the dielectric layer may be formed of silicon dioxide.

(F3) Either of the LDMOS transistors denoted as (F1) through (F2) may further include a source conductive plug extending through the dielectric layer in the thickness direction and contacting the source n+ region.

(F4) In the LDMOS transistor denoted as (F3), the silicon semiconductor structure may further include a source p+ region formed in the p-body, and the LDMOS transistor may further include a body conductive plug extending through the dielectric layer in the thickness direction and contacting the source p+ region.

(F5) In the LDMOS transistor denoted as (F4), the source p+ region may have a greater p-type dopant concentration than the p-body, and each of the source and drain n+ regions may have a greater n-type dopant concentration than the n-well.

(F6) Either of the LDMOS transistors denoted as (F4) or (F5) may further include a source electrode contacting each of the body conductive plug and the source conductive plug, a gate electrode contacting the gate conductor, and a drain electrode contacting the drain conductive plug.

(F7) A switching circuit may include the LDMOS transistor of (F6) and driver circuitry for repeatedly driving the gate electrode between at least two different voltage magnitudes relative to the source electrode.

(G1) A lateral double-diffused metal-oxide-semiconductor field effect (LDMOS) transistor may include a silicon semiconductor structure including a substrate, an n-well formed on the substrate, first and second p-bodies formed in the n-well and laterally disposed on opposite respective sides of a trench in the silicon semiconductor structure, an n-type laterally diffused drain formed in the n-well and partially surrounding the trench, and a drain n+ region formed in the n-type laterally diffused drain below the trench in a thickness direction. The drain n+ region may be separated from each of the first and second p-bodies in a lateral direction. The LDMOS transistor may further include a dielectric layer disposed in the trench, a drain conductive plug extending through the dielectric layer and the trench in the thickness direction to contact the drain n+ region, and first and second gate conductors embedded in the dielectric layer and extending into the trench in the thickness direction, where the first and second gate conductors are laterally disposed on opposite respective sides of the drain conductive plug.

(G2) In the LDMOS transistor denoted as G1, each of the first and second gate conductors may be formed of polysilicon, and the dielectric layer may be formed of silicon dioxide.

(G3) In any of the LDMOS transistors denoted as (G1) through (G2), the silicon semiconductor structure may further include a first source p+ region and a first source n+ region disposed in the first p-body, and a second source p+ region and a second source n+ region disposed in the second p-body. Additionally, the LDMOS transistor may further include a first source conductive plug extending along each of the first source p+ region and the first source n+ region in the thickness direction to contact the first p-body and a second source conductive plug extending along each of the second source p+ region and the second source n+ region in the thickness direction to contact the second p-body.

(G4) In the LDMOS transistor denoted as (G3), the first source p+ region may have a greater p-type dopant concentration than the first p-body, the second source p+ region may have a greater p-type dopant concentration than the second p-body, each of the first source n+ region, the second source n+ region, and the drain n+ region may have a greater n-type dopant concentration than the n-type laterally diffused drain, and the n-type laterally diffused drain may have a greater n-type dopant concentration than the n-well.

(G5) Any of the LDMOS transistors denoted as (G3) through (G4) may further include a source electrode contacting each of the first and second source conductive plugs, a gate electrode contacting each of the first and second gate conductors, and a drain electrode contacting the drain conductive plug.

(G6) A switching circuit may include the LDMOS transistor denoted as (G5) and driver circuitry for repeatedly driving the gate electrode between at least two different voltage magnitudes relative to the source electrode.

(H1) A lateral double-diffused metal-oxide-semiconductor field effect (LDMOS) transistor may include a silicon semiconductor structure including a substrate, an n-well formed on the substrate, a p-body formed in the n-well and adjacent in a lateral direction to a trench formed in the silicon semiconductor structure, a first n-type drift region formed in the p-body, an n-type laterally diffused drain formed below the trench in a thickness direction, and a second n-type drift region formed in the n-well such the first and second n-type drift regions are disposed on opposite respective sides of the trench in the lateral direction. The LDMOS transistor may further include a dielectric layer disposed in the trench and a gate conductor embedded in the dielectric layer and extending into the trench in the thickness direction.

(H2) In the LDMOS transistor denoted as (H1), a lateral separation distance between the gate conductor and the first drift region may be less than a lateral separation distance between the gate conductor and the second drift region.

(H3) In any of the LDMOS transistors denoted as (H1) through (H2), the gate conductor may be separated from the silicon semiconductor structure by the dielectric layer.

(H4) In any of the LDMOS transistors denoted as (H1) through (H3), the gate conductor may be formed of polysilicon, and the dielectric layer may be formed of silicon dioxide.

(H5) In any of the LDMOS transistors denoted as (H1) through (H4), the silicon semiconductor structure may further include (1) a source p+ region and a source n+ region formed in the p-body, where the source p+ region and the source n+ region are adjacent in the lateral direction, and (2) a drain n+ region formed in the second drift region, where the drain n+ region is separated from the source n+ region in the lateral direction. Additionally, the first n-type drift region may be formed in the p-body below each of the source p+ region and the source n+ region in the thickness direction, and the LDMOS transistor may further include a source conductive plug extending along each of the source p+ region and the source n+ region and through the first n-type drift region in the thickness direction, to contact the p-body.

(H6) In the LDMOS transistor denoted as (H5), the source p+ region may have a greater p-type dopant concentration than the p-body, each of the source n+ region and the drain n+ region may have a greater n-type dopant concentration than the n-type laterally diffused drain, the n-type laterally diffused drain may have a greater n-type dopant concentration than each of the first and second n-type drift regions, and each of the first and second n-type drift regions may have a greater n-type dopant concentration than the n-well.

(H7) Any of the LDMOS transistors denoted as (H5) and (H6) may further include a source electrode contacting the source conductive plug, a gate electrode contacting the gate conductor, and a drain electrode contacting the drain n+ region.

(H8) A switching circuit may include the LDMOS transistor of claim (H7) and driver circuitry for repeatedly driving the gate electrode between at least two different voltage magnitudes relative to the source electrode.

Changes may be made in the above devices, methods, and systems without departing from the scope hereof. For example, the n-channel LDMOS transistors discussed above could be modified to be p-channel LDMOS transistors. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A lateral double-diffused metal-oxide-semiconductor field effect (LDMOS) transistor, comprising:
a silicon semiconductor structure, including a source region and a drain region separated from each other in a lateral direction, the source region including a source n+ region formed in a p-body, and the drain region including a drain n+ region; and
a gate structure formed at least partially in a trench of the silicon semiconductor structure between the source region and the drain region in the lateral direction, the gate structure being at least substantially symmetrical, as seen when the LDMOS transistor is viewed cross-sectionally in a direction orthogonal to the lateral direction, the gate structure including:
a dielectric layer at least partially disposed in the trench in a thickness direction, the thickness direction being orthogonal to the lateral direction, and
a gate conductor embedded in the dielectric layer and extending into the trench in the thickness direction,
wherein the p-body borders the trench in the lateral direction.

2. The LDMOS transistor of claim 1, further comprising a first spacer and a second spacer bounding the gate structure on a first outer surface of the silicon semiconductor structure, the trench extending into the silicon semiconductor structure in the thickness direction from the first outer surface of the silicon semiconductor structure.

3. The LDMOS transistor of claim 2, wherein the first spacer and the second spacer are separated from each other in the lateral direction.

4. The LDMOS transistor of claim 1, wherein the dielectric layer separates the gate conductor from the silicon semiconductor structure.

5. The LDMOS transistor of claim 1, wherein:
the source region and the drain region are formed in an n-well of the silicon semiconductor structure; and
the source n+ region is separated from the n-well at least partially by the p-body.

6. The LDMOS transistor of claim 1, further comprising:
a source electrode contacting at least the source n+ region;
a gate electrode contacting the gate conductor; and
a drain electrode contacting the drain n+ region.

7. The LDMOS transistor of claim 1, the gate conductor being formed of polysilicon, and the dielectric layer being formed of silicon dioxide.

8. A lateral double-diffused metal-oxide-semiconductor field effect (LDMOS) transistor, comprising:
a silicon semiconductor structure, including a source region and a drain region separated from each other in a lateral direction;
a gate structure formed at least partially in a trench of the silicon semiconductor structure between the source region and the drain region in the lateral direction, wherein:
the gate structure includes a dielectric layer and a gate conductor, the dielectric layer being at least partially disposed in the trench in a thickness direction, the thickness direction being orthogonal to the lateral direction, and the gate conductor being embedded in the dielectric layer and extending into the trench in the thickness direction, and
a portion of the gate conductor extends above the silicon semiconductor structure and forms a u-shape that is at least substantially symmetrical, as seen when the LDMOS transistor is viewed cross-sectionally in a direction orthogonal to the lateral direction; and
a first spacer and a second spacer bounding the gate structure on a first outer surface of the silicon semiconductor structure, the trench extending into the silicon semiconductor structure in the thickness direction from the first outer surface of the silicon semiconductor structure.

9. The LDMOS transistor of claim 8, wherein the first spacer and the second spacer are separated from each other in the lateral direction.

10. The LDMOS transistor of claim 8, wherein the dielectric layer separates the gate conductor from the silicon semiconductor structure.

11. The LDMOS transistor of claim 8, wherein:
the source region comprises a source n+ region formed in a p-body; and
the drain region comprises a drain n+ region.

12. The LDMOS transistor of claim 11, wherein the p-body borders the trench in the lateral direction.

13. The LDMOS transistor of claim 12, wherein:
the source region and the drain region are formed in an n-well of the silicon semiconductor structure; and
the source n+ region is separated from the n-well at least partially by the p-body.

14. The LDMOS transistor of claim 11, further comprising:
a source electrode contacting at least the source n+ region;
a gate electrode contacting the gate conductor; and
a drain electrode contacting the drain n+ region.

15. The LDMOS transistor of claim 8, the gate conductor being formed of polysilicon, and the dielectric layer being formed of silicon dioxide.

16. A lateral double-diffused metal-oxide-semiconductor field effect (LDMOS) transistor, comprising:
a silicon semiconductor structure, including a source region and a drain region separated from each other in a lateral direction; and
a gate structure formed at least partially in a trench of the silicon semiconductor structure between the source region and the drain region in the lateral direction, the trench extending into the silicon semiconductor structure in a thickness direction from a first outer surface of the silicon semiconductor structure, the thickness direction being orthogonal to the lateral direction, the gate structure being at least substantially symmetrical, as seen when the LDMOS transistor is viewed cross-sectionally in a direction orthogonal to the lateral direction, the gate structure including:
a dielectric layer at least partially disposed in the trench in the thickness direction, and
a gate conductor embedded in the dielectric layer and extending into the trench in the thickness direction,
a first spacer and a second spacer bounding the gate structure on the first outer surface of the silicon semiconductor structure.

17. The LDMOS transistor of claim 16, wherein the first spacer and the second spacer are separated from each other in the lateral direction.

* * * * *